(12) United States Patent
Paci et al.

(10) Patent No.: US 9,018,946 B2
(45) Date of Patent: Apr. 28, 2015

(54) MAGNETIC FIELD SENSOR HAVING ANISOTROPIC MAGNETORESISITIVE ELEMENTS, WITH IMPROVED ARRANGEMENT OF MAGNETIZATION ELEMENTS THEREOF

(75) Inventors: Dario Paci, Cornaredo (IT); Sarah Zerbini, Fontanellato (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 552 days.

(21) Appl. No.: 13/333,848

(22) Filed: Dec. 21, 2011

(65) Prior Publication Data

US 2012/0161756 A1    Jun. 28, 2012

(30) Foreign Application Priority Data

Dec. 27, 2010   (IT) ................ TO2010A1068

(51) Int. Cl.
   *G01R 33/12*   (2006.01)
   *G01R 33/09*   (2006.01)
   *B82Y 25/00*   (2011.01)
   *G01R 33/00*   (2006.01)

(52) U.S. Cl.
   CPC ............... *G01R 33/093* (2013.01); *B82Y 25/00* (2013.01); *G01R 33/0011* (2013.01)

(58) Field of Classification Search
   None
   See application file for complete search history.

(56) References Cited

U.S. PATENT DOCUMENTS

| | | | |
|---|---|---|---|
| 4,847,584 A | 7/1989 | Pant | |
| 5,247,278 A | 9/1993 | Pant et al. | |
| 5,952,825 A | 9/1999 | Wan | |
| 6,020,738 A | 2/2000 | Van Den Berg et al. | |
| 6,556,007 B1 * | 4/2003 | Abe et al. | 324/252 |
| 6,707,298 B2 * | 3/2004 | Suzuki et al. | 324/252 |
| 6,717,403 B2 * | 4/2004 | Witcraft et al. | 324/252 |
| 6,850,057 B2 | 2/2005 | Witcraft et al. | |
| 7,057,173 B2 | 6/2006 | Wright | |
| 7,138,798 B1 * | 11/2006 | Abe et al. | 324/252 |
| 7,196,875 B2 * | 3/2007 | Chilcote et al. | 360/313 |
| 7,358,722 B2 * | 4/2008 | Peczalski et al. | 324/247 |
| 7,816,905 B2 | 10/2010 | Doogue et al. | |
| 7,990,139 B2 | 8/2011 | Abe et al. | |
| 8,115,286 B2 | 2/2012 | Zhang et al. | |
| 2004/0111906 A1 * | 6/2004 | Abe et al. | 33/355 R |
| 2007/0165334 A1 * | 7/2007 | Takenaga et al. | 360/313 |
| 2007/0262773 A1 | 11/2007 | Witcraft et al. | |
| 2008/0258722 A1 | 10/2008 | Zon et al. | |
| 2013/0299930 A1 * | 11/2013 | Paci et al. | 257/422 |
| 2014/0015525 A1 * | 1/2014 | Paci et al. | 324/252 |

\* cited by examiner

*Primary Examiner* — Paresh Patel
(74) *Attorney, Agent, or Firm* — Seed IP Law Group PLLC

(57) ABSTRACT

An integrated magnetic-field sensor designed to detect an external magnetic field, comprising a first magnetoresistive structure for detecting the external magnetic field, the first magnetoresistive structure including first magnetoresistive means having a main axis of magnetization and a secondary axis of magnetization set orthogonal to one another. The magnetic-field sensor further comprises a magnetic-field generator, including a first portion configured for generating a first magnetic field having field lines in a first field direction, and a second portion, which is coplanar and is connected to the first portion, configured for generating a second magnetic field having field lines in a second field direction, the first magnetoresistive means being configured so that the main axis of magnetization extends parallel to the first field direction, and the secondary axis of magnetization extends parallel to the second field direction.

24 Claims, 13 Drawing Sheets

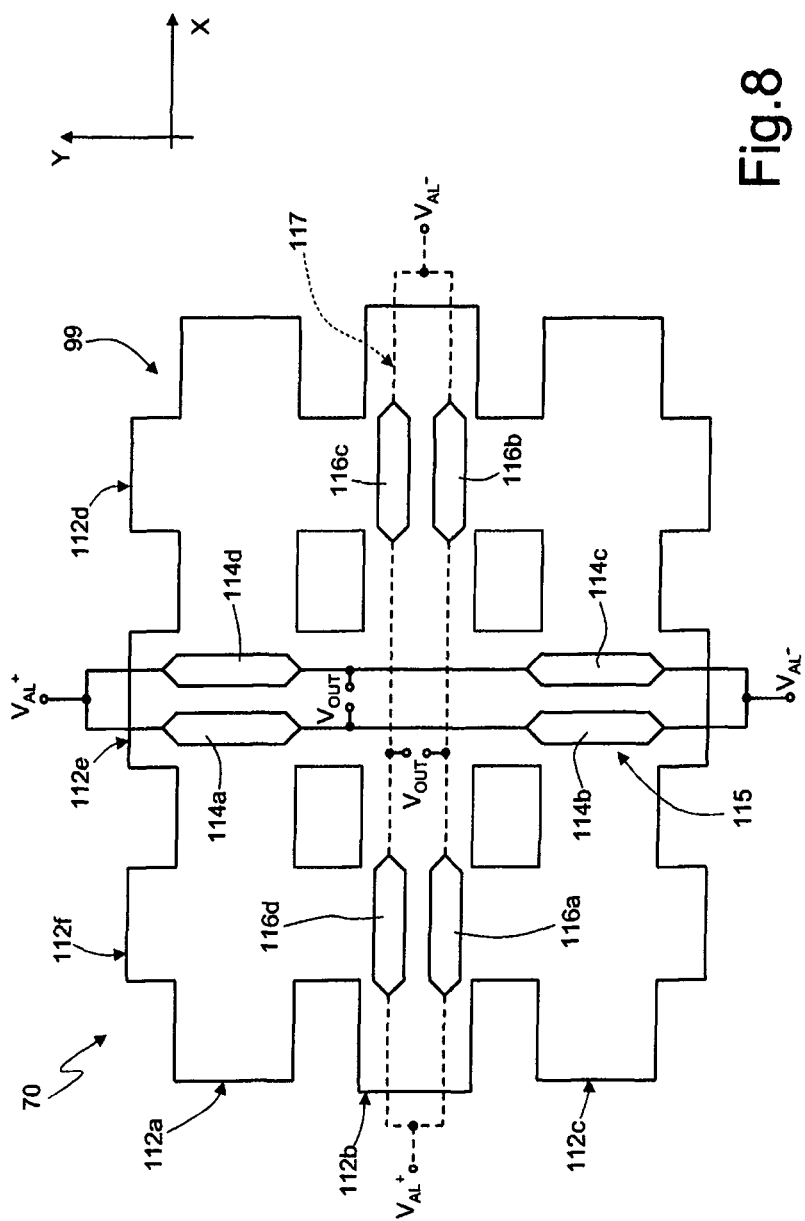

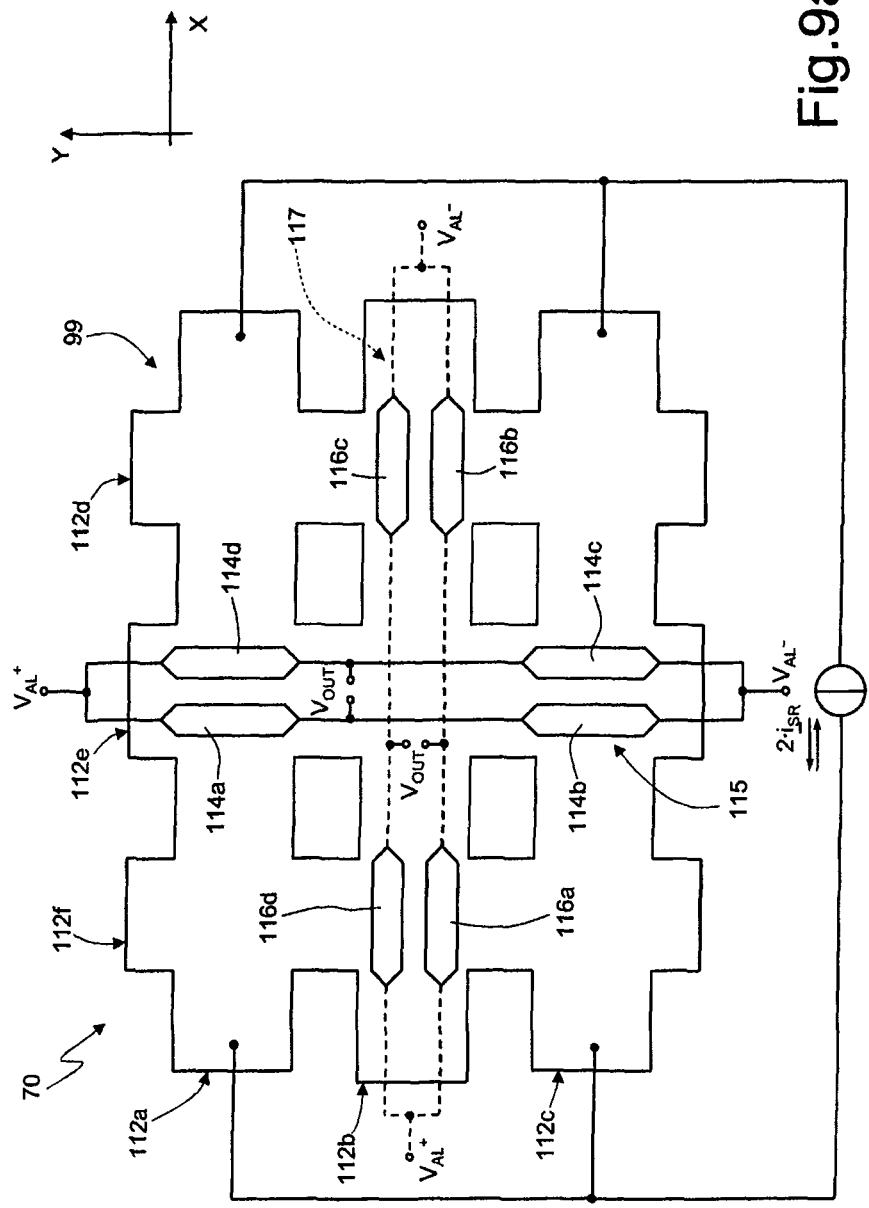

MAGNETIC FIELD SENSOR HAVING ANISOTROPIC MAGNETORESISITIVE ELEMENTS, WITH IMPROVED ARRANGEMENT OF MAGNETIZATION ELEMENTS THEREOF

BACKGROUND

1. Technical Field

The present disclosure relates to a magnetic-field sensor, in particular one comprising anisotropic magnetoresistive elements.

2. Description of the Related Art

Magnetic-field sensors, in particular anisotropic-magnetoresistive (AMR) sensors, are used in a plurality of applications and systems, for example in compasses, in systems for detecting ferromagnetic materials, in the detection of currents, and in a wide range of other applications, thanks to their capacity for detecting natural magnetic fields (for example, the Earth's magnetic field) and magnetic fields generated by electrical components (such as electrical or electronic devices and lines traversed by electric current).

In a known way, the phenomenon of anisotropic magnetoresistivity occurs within particular ferromagnetic materials, which, when subjected to an external magnetic field, undergo a variation of resistivity as a function of the characteristics of the magnetic field applied. Usually, said materials are shaped in thin strips so as to form resistive elements, and the resistive elements thus formed are electrically connected together to form a bridge structure (typically a Wheatstone bridge).

It is moreover known to produce AMR magnetic sensors with standard semiconductor-micromachining techniques, as described for example in the document No. U.S. Pat. No. 4,847,584. In particular, each magnetoresistive element can be formed by a film of magnetoresistive material, such as for example permalloy (a ferromagnetic alloy containing iron and nickel), deposited to form a thin strip on a substrate made of semiconductor material, for example silicon.

When an electric current is made to flow through a magnetoresistive element, the angle θ between the direction of magnetization of said magnetoresistive element and the direction of the flow of the current affects the effective resistivity value of the magnetoresistive element itself so that, as the value of the angle θ varies, the value of electrical resistance varies (in detail, said variation follows a law of the $\cos^2 \theta$ type).

For example, a direction of magnetization parallel to the direction of the flow of current results in a maximum value of resistance to the passage of current through the magnetoresistive element, whereas a direction of magnetization orthogonal to the direction of the flow of current results at a minimum value of resistance to the passage of current through the magnetoresistive element.

AMR magnetic sensors further include a plurality of straps integrated in the sensors themselves (typically two straps), the so-called "set/reset strap" and "offset strap", which are designed to generate, when traversed by a current of an appropriate value, a magnetic field that is coupled in a direction perpendicular to the direction of detection of the sensors and in the direction of detection of the sensors, respectively; in this regard, see for example the document No. U.S. Pat. No. 5,247,278.

The set/reset strap has the function of varying, alternating it, the sense of magnetization of the magnetoresistive elements in a first pre-defined direction (the so-called "easy axis" or EA). In use, the variation of the sense of magnetization is obtained by applying to the magnetoresistive element, via the set/reset strap, a magnetic field of an appropriate value for a short period of time such as to force arbitrarily the orientation of the magnetic dipoles of the magnetoresistive element in the first pre-defined direction ("set" operation), and then by applying to the magnetoresistive element a second magnetic field, similar to the previous but with opposite sense, so as to force the orientation of the magnetic dipoles of the magnetoresistive element once again in the first pre-defined direction, but with opposite sense ("reset" operation). The set and reset operations have the function of sending each magnetoresistive element of the AMR sensor into a respective single-domain state before operating the AMR sensor, for example in order to carry out operations of sensing of an external magnetic field. The set and reset operations are used because only in the single-domain state are the fundamental properties of linearity, sensitivity, and stability of the magnetoresistive elements controlled and repeatable. The aforementioned set and reset operations are known and described in detail, for example, in the document No. U.S. Pat. No. 5,247,278.

The offset strap is normally used for operations of compensation of offsets present in the AMR sensor (on account of mismatch in the values of the corresponding electrical components), self-test operations, and/or operations of calibration of the AMR sensor. In particular, the value of the electrical quantities at output from the AMR sensor is, in the presence of the offset strap, a function both of the external magnetic field to be detected and of the magnetic field generated as a result of a current circulating in the offset strap. The offset strap is formed by turns of conductive material, for example metal, arranged on the same substrate as that on which the magnetoresistive elements of the sensor and the set/reset strap are provided (in different metal layers), and is electrically insulated from, and set in the proximity of, said magnetoresistive elements. The magnetic field generated by the offset strap is such as to force partially the orientation of the magnetic dipoles of each magnetoresistive element in a second pre-defined direction (the so-called "hard axis" or HA), orthogonal to the first pre-defined direction.

FIG. 1 shows, in top plan view, a layout provided by way of example of an integrated magnetic-field sensor 1 of a known type comprising a plurality of magnetoresistive elements, connected to one another so as to form a Wheatstone bridge, for example as described in the document Nos. U.S. Pat. No. 5,247,278 and U.S. Pat. No. 5,952,825, and manufactured according, for example, to what is described in the document No. U.S. Pat. No. 4,847,584.

More in particular, each magnetoresistive element has a structure of the barber-pole type. The barber-pole structure for magnetoresistive elements is known. In this case, each magnetoresistive element is formed by a plurality of magnetoresistive sub-elements arranged substantially in line with one another and connected to one another by means of connection elements with high electrical conductivity (for example, ones made of aluminum, copper, silver, or gold). The connection elements are arranged adjacent to, in direct electrical contact with, each magnetoresistive sub-element and inclined by a certain angle α (typically, α=45°) with respect to the axis of spontaneous magnetization of the magnetoresistive element.

The magnetic-field sensor 1 is formed on a semiconductor substrate 2 by means of a technological process of a known type. Four magnetoresistive elements 4, 6, 8, and 10, in the form of strips made of ferromagnetic material (for example, deposited thin film comprising an Ni/Fe alloy), in barber-pole configuration, are arranged to form a Wheatstone bridge. For each magnetoresistive element 4, 6, 8, 10, the magnetoresistive strips that form it are connected together in series. With reference to FIG. 1, the magnetoresistive elements 4, 6, 8, 10 are interconnected and connected to pads 21, 22, 23, 24, and 25. The pad 21 is connected to the magnetoresistive element 4 by means of a conductive path 11, and the magnetoresistive element 4 is connected to the magnetoresistive element 6 by means of a conductive portion 16. The conductive portion 16 is electrically connected to the pad 22 by means of a respective conductive path 12. The magnetoresistive element 6 is then connected to the magnetoresistive element 10 by means of a conductive portion 18, and the conductive portion 18 is electrically connected to the pad 23 by means of a respective conductive path 13. The magnetoresistive element 10 is interconnected to the magnetoresistive element 8 by means of a conductive portion 17, and the conductive portion 17 is electrically connected to the pad 24 by means of a respective conductive path 14. The pad 25 is connected to the magnetoresistive element 8 by means of a conductive portion 15.

A resistive Wheatstone-bridge structure is thus formed, which provides a magnetic-field sensor 1 sensitive to components of magnetic field having a direction perpendicular to the strips made of ferromagnetic material that form the magnetoresistive elements 4, 6, 8, 10. The pad 21 is connected to the pad 25, to form a common pad so as to connect the magnetoresistive element 4 and the magnetoresistive element 8 electrically together.

In use, an input voltage Vin is applied between the pad 22 and the pad 24. Reading of the output voltage Vout is carried out between the pad 21 (common to the pad 25) and the pad 23.

With reference to FIG. 1, the magnetic-field sensor 1 further comprises a first strip of electrically conductive material, which extends on the substrate 2 and is insulated from the latter by means of a layer of dielectric material (not shown in detail in the figure). Said first strip of electrically conductive material forms a first winding 19, of a planar type, which extends in a plane parallel to the plane in which the magnetoresistive elements 4, 6, 8, 10 lie and is electrically insulated from the magnetoresistive elements 4, 6, 8, 10.

The magnetic-field sensor 1 further comprises a second strip of electrically conductive material, which extends on the substrate 2, and is insulated from the latter and from the first winding 19 by means of a layer of dielectric material (not shown in detail in the figure). Said second strip of electrically conductive material forms a second winding 20, of a planar type, which extends between a terminal 20a and a terminal 20b in a plane parallel to the plane in which the magnetoresistive elements 4, 6, 8, 10 and the first winding 19 lie and is electrically insulated from the magnetoresistive elements 4, 6, 8, 10 and from the first winding 19.

The first winding 19 is used when it is desired to generate a magnetic field of known intensity interacting with the magnetic-field sensor 1, with purposes of biasing, calibration, and/or compensation of possible offsets due to the presence of undesirable external magnetic fields. In the latter case, the effect of the magnetic field generated by the first winding 19 on the output signal Vout of the magnetic-field sensor 1 is that of balancing the output signal due exclusively to the undesirable external field in order to generate a zero output signal.

In use, when the first winding 19 is traversed by electric current, a magnetic field is generated the lines of force of which have a direction parallel to the plane in which the magnetoresistive elements 4, 6, 8, 10 lie, or in any case a direction parallel to the direction of sensitivity of the magnetoresistive elements 4, 6, 8, 10.

On account of the variability of the process of manufacture of the magnetoresistive elements 4, 6, 8, 10, said magnetoresistive elements 4, 6, 8, 10 can have structural characteristics different from one another. This generates an offset signal Voff, superimposed on the useful output signal, intrinsic to the magnetic-field sensor 1, which causes a reduction of the sensitivity of the magnetic-field sensor 1 during use. Said offset signal Voff can be eliminated by appropriately operating the second winding 20. In greater detail, during use, current pulses are made to flow in the second winding 20 with a direction opposite to one another (by appropriately biasing the terminals 20a and 20b of the second winding) so as to generate respective magnetic fields defined by respective field lines having senses opposite to one another. Said magnetic fields have an intensity such as to re-orient the magnetic dipoles of the magnetoresistive elements 4, 6, 8, 10 according to the field lines generated, in particular with a sense defined by the sense of the lines of the magnetic field generated.

Following upon a first current pulse (referred to as "set pulse") through the second winding 20, a first magnetic field $H_{s1}$ is generated such as to orient the magnetic dipoles of the magnetoresistive elements 4, 6, 8, 10 according to a first sense.

Following upon a second current pulse (referred to as "reset pulse") through the second winding 20, a second magnetic field $H_{S2}$ (of intensity, for example, equal to that of the first magnetic field $H_{S1}$) is generated such as to orient the magnetic dipoles of the magnetoresistive elements 4, 6, 8, 10 in a second sense.

The AMR sensor described with reference to FIG. 1 hence requires, in order to be correctly operated, at least two straps (the set/reset strap and the offset strap).

The presence of said straps complicates the process of fabrication of the AMR sensor, and the manufacturing cost thereof increases in so far as it uses masks dedicated to formation of two different straps on different metal levels and to formation of metal connections (via holes) through the wafer for providing the electrical supply for biasing said straps.

BRIEF SUMMARY

One embodiment of the present disclosure is a magnetic-field sensor that is free from the drawbacks of magnetic-field sensors of a known type, highlighted previously.

According to the present disclosure a magnetic-field sensor is provided as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 8 shows a magnetic-field sensor of the AMR type according to a further embodiment of the present disclosure;

FIGS. 9a-9d show the magnetic-field sensor of FIG. 8 in different modes of use;

DETAILED DESCRIPTION

Figure 1:
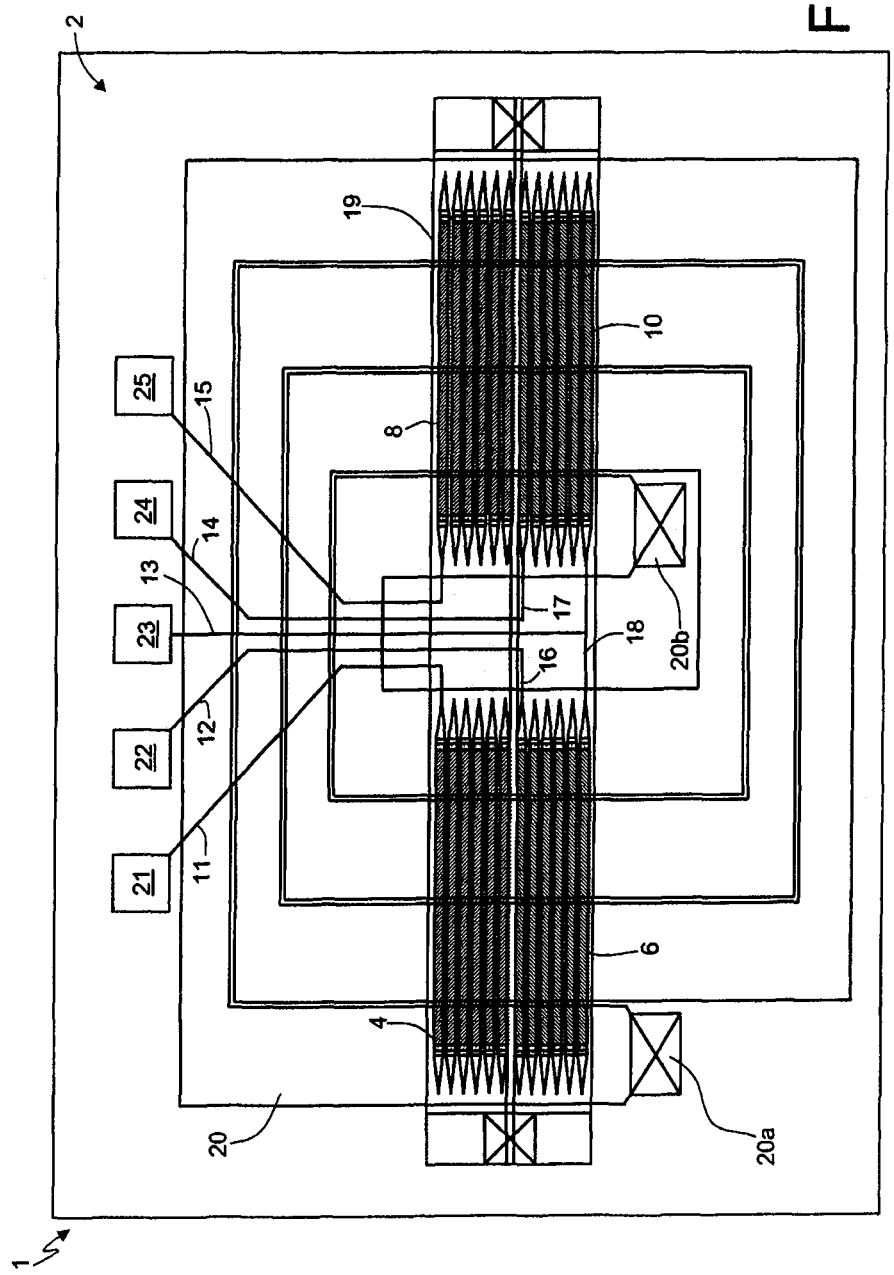
FIG. 1 shows a magnetic-field sensor of the AMR type according to the known art.
Figure 2:
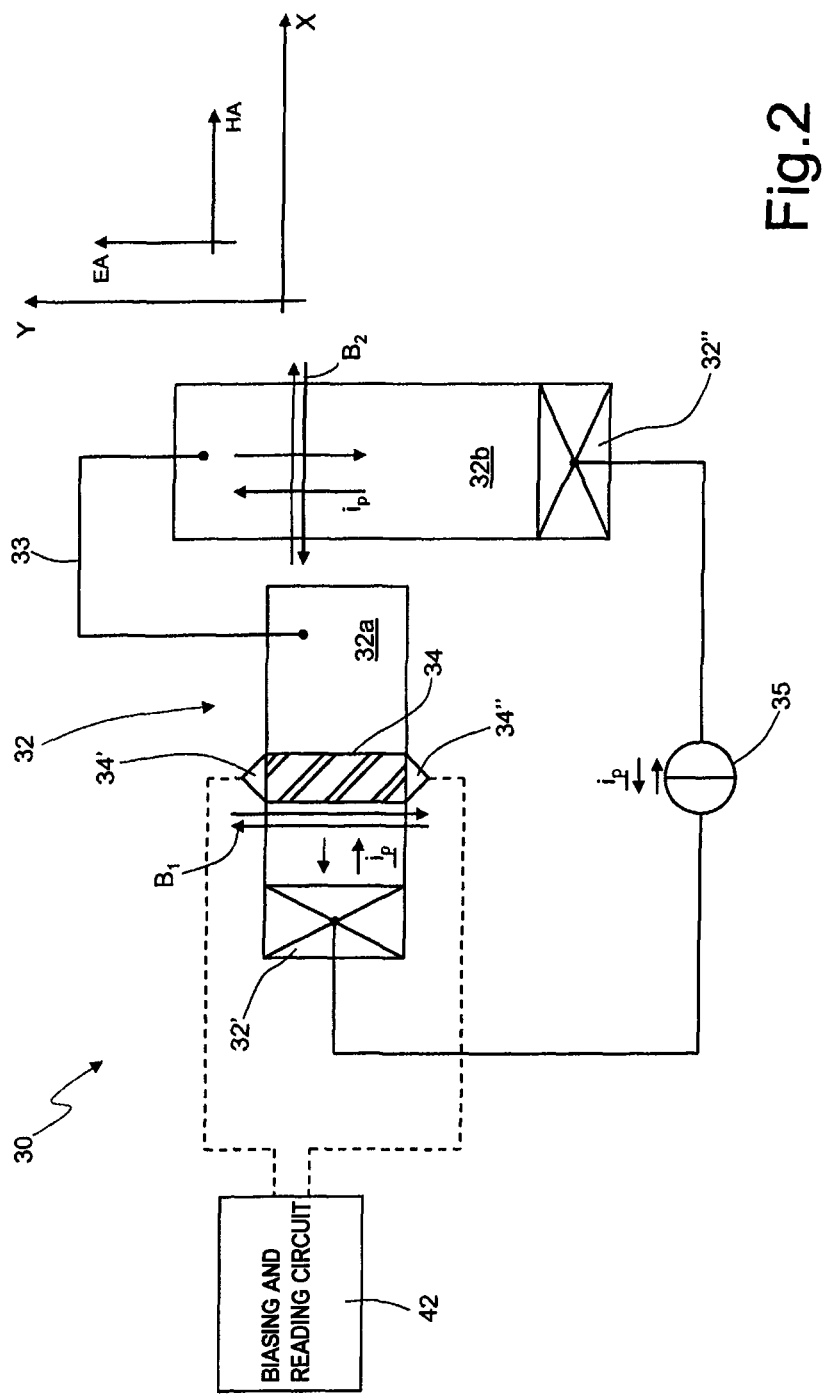
FIG. 2 shows a magnetic-field sensor of the AMR type according to one embodiment of the present disclosure.

FIG. 2 shows, in top plan view and in schematic form, a magnetic-field sensor 30 according to one embodiment of the present disclosure. The magnetic-field sensor 30, unlike the magnetic-field sensor 1 of FIG. 1, comprises a magnetic-field generator 32, here in particular formed by electrically connected planar conductive strips, configured for carrying out both the set/reset operation and the operation of calibration/offset compensation of the magnetoresistive elements (just one magnetoresistive element 34 is shown in the figure) of the magnetic-field sensor 30. The magnetic-field generator 32 can hence be operated indifferently with the purpose of set/reset (as described with reference to the strap 20 of FIG. 1) or with the purpose of calibration during the testing stage or offset compensation (as described with reference to the strap 19 of FIG. 1), or simultaneously with both purposes of set/reset and calibration/offset compensation.

The magnetic-field generator 32 comprises a first conductive portion 32a and a second conductive portion 32b, electrically connected by means of an electrical connection portion 33. The first and second conductive portions 32a, 32b extend longitudinally in the same plane XY and are hence coplanar. In particular, the first and second conductive portions 32a, 32b are made of metal material (for example, aluminum, copper, gold, etc.) and are formed in one and the same metal level. Even more in particular, also the electrical connection portion 33 is made of metal and is formed in the same metal level as the first and second conductive portions 32a, 32b.

The conductive portion 32a comprises a first terminal 32' connected to a respective terminal of a current generator 35; the conductive portion 32b comprises a second terminal 32" connected to another terminal of the current generator 35. In this way, in use, a current $i_p$ flows between the first terminal 32' and the second terminal 32", or vice versa.

For the purposes of the present description, the current $i_p$ corresponds to the set/reset current $i_{SR}$ when the magnetic-field generator 32 is operated in order to carry out operations of set and reset of the magnetoresistive element 34, and to the calibration/offset-compensation current $i_{OFF}$ when the magnetic biasing element is operated in order to carry out operations of calibration/offset compensation.

As shown in FIG. 2, in the first conductive portion 32a the current $i_p$ flows in a direction parallel to the axis X, whilst in the second conductive portion 32b the current $i_p$ flows in a direction perpendicular to the axis X. In this way, in a region corresponding to each of the portions 32a and 32b a respective magnetic field $B_1$ and $B_2$ is generated having field lines oriented in a direction perpendicular to the direction of flow of the current $i_p$, and hence oriented parallel to the axis Y and X, respectively.

The magnetic-field sensor 30 further comprises a magnetoresistive element 34 set in a position corresponding to the first conductive portion 32a so that a preferred axis of magnetization (in particular, the easy axis EA) of the magnetoresistive element 34 extends parallel to the lines of flux of the magnetic field $B_1$ (along the axis Y), and a secondary axis of magnetization (in particular, the hard axis HA) of the magnetoresistive element 34 extends parallel to the lines of flux of the magnetic field $B_2$ (along the axis X). In this way, the magnetoresistive element is subject to a magnetization both along the easy axis EA and along the hard axis HA.

For the purposes of the present description, the current $i_p$ corresponds to the set/reset current $i_{SR}$ when the magnetic-field generator 32 is operated in order to carry out operations of set and/or reset of the magnetoresistive element 34, and to the calibration/offset-compensation current $i_{OFF}$ when the magnetic-field generator 32 is operated in order to carry out operations of calibration/offset compensation.

Figure 3:
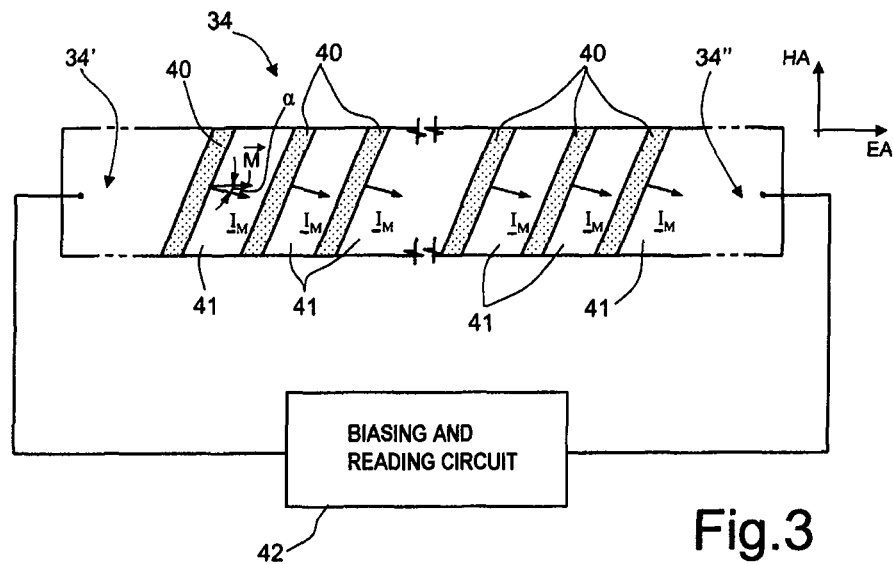
FIG. 3 shows a magnetoresistive element that can be used in the sensor of FIG. 2 and is provided with a barber-pole structure.

The magnetoresistive element 34 of the magnetic-field sensor 30 has, according to one embodiment of the present disclosure, a structure of the barber-pole type, schematically illustrated in FIG. 3.

Each magnetoresistive element can be formed as a single strip of ferromagnetic material (for example, deposited thin films comprising an Ni/Fe alloy), typically in a barber-pole configuration, or as a plurality of sub-elements of ferromagnetic material, for example in the form of strips. In the case where each magnetoresistive element is formed by a plurality of sub-elements of ferromagnetic material, said sub-elements are connected together in series.

The magnetoresistive element 34 is disposed electrically insulated from the magnetic-field generator 32 in an area at least partially overlying, or underlying, or close to, the magnetic-field generator 32, and in any case so as to interact with the magnetic fields $B_1$ and $B_2$ generated by the portions 32a and 32b of the magnetic-field generator 32 when traversed by the current $i_p$.

FIG. 3 shows, in top plan view, a magnetoresistive element 34. The magnetoresistive element 34 comprises a portion of magnetoresistive material 41 (for example, a nickel and iron alloy, more in particular, permalloy) in ohmic contact with a barber-pole structure 40, with high electrical conductivity (for example, made of metal such as aluminum, silver, gold, etc.). The elements of the barber-pole structure 40 are inclined by a certain angle α (typically, α=45°) with respect to the axis of spontaneous magnetization of the magnetoresistive element (indicated in the figure by means of the vector M).

The magnetoresistive element 34 possesses terminal portions 34' and 34", which are in electrical connection with the portion of magnetoresistive material 41 and can be connected to a biasing and reading circuit 42, of a known type. The biasing and reading circuit 42 is configured for generating a flow of current $I_M$ between the terminals 34' and 34" of the magnetoresistive element and reading the value of resistance of the magnetoresistive element to the passage of the current (indicated by means of the current vector $\underline{I}_M$). As a result of the barber-pole structure, the current vector $\underline{I}_M$, indicating the flow of current between facing elements of the barber-pole structure 40, is oriented so as to present an angle α with the magnetization vector M.

A possible external magnetic field, having a field component perpendicular to the easy axis EA (i.e., parallel to the hard axis HA), applied to the magnetoresistive element 34, causes a rotation of the magnetization vector M and a consequent variation of the value of the angle α. This consequently causes a variation of the electrical resistance of the magnetoresistive element 34 (also referred to as magnetoresistive effect), which can be detected by the biasing and reading circuit 42 by acquiring and analyzing an output signal picked up at the terminal portions 34' and 34".

The connection portion 33 can be provided, for example, as prolongation of the conductive portion 32a and/or 32b.

Figure 4:
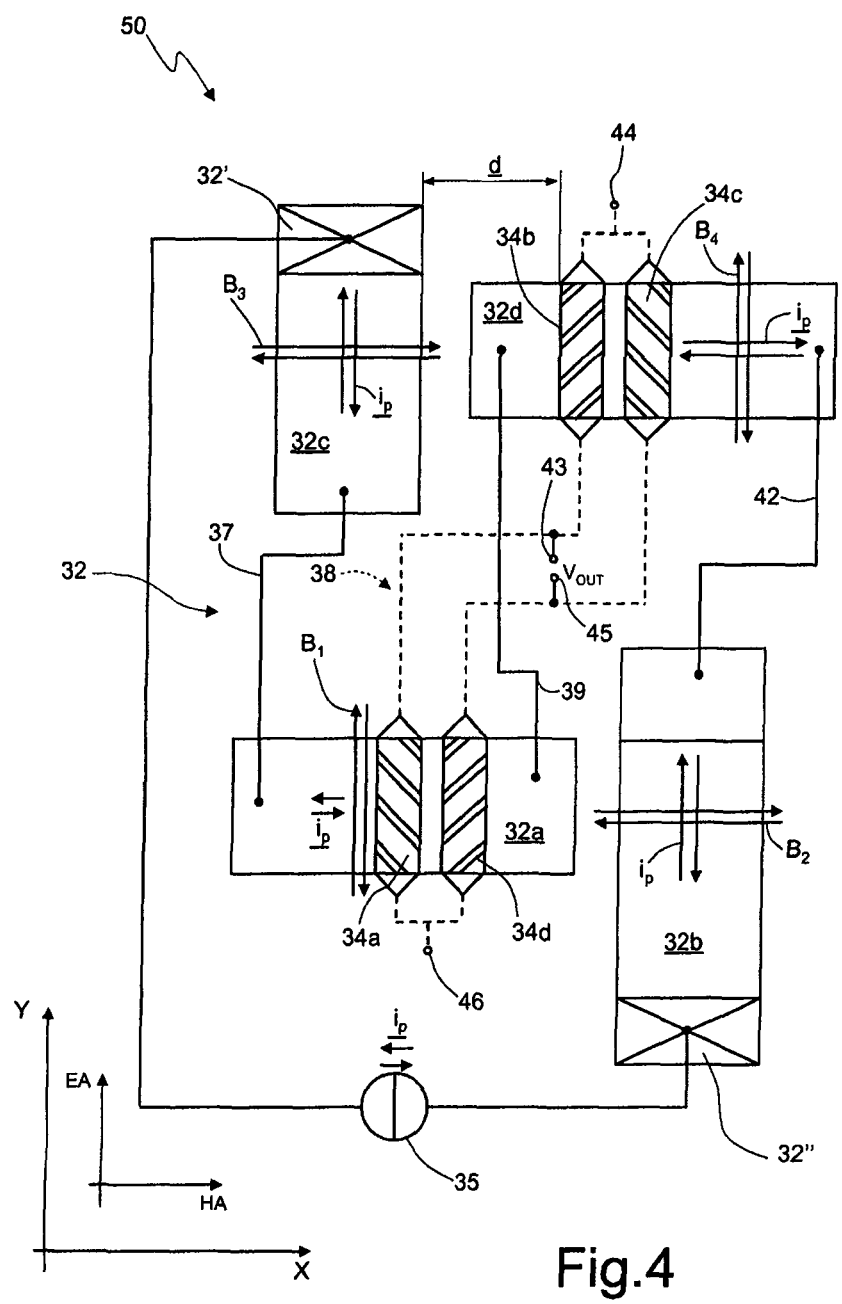
FIG. 4 shows a magnetic-field sensor of the AMR type according to a further embodiment of the present disclosure.

FIG. 4 shows a magnetic-field sensor 50 according to a further embodiment of the present disclosure. The magnetic-field sensor 50 comprises, like the magnetic-field sensor 30, the magnetic-field generator 32 of a planar type, here in particular formed by a planar conductive strip comprising a plurality of conductive portions (in particular, more than two conductive portions) electrically connected together.

The magnetic-field generator 32 is configured for carrying out both the operation of set/reset and the operation of calibration/offset compensation of the magnetoresistive elements 34a-34d (four magnetoresistive elements connected to form a Wheatstone bridge 38 are shown in FIG. 4). The magnetic-field generator 32 can hence be operated indifferently with the purpose of set/reset or with the purpose of calibration during the testing stage or offset compensation, or simultaneously with both purposes of set/reset and calibration/offset compensation.

The magnetic-field generator 32 of FIG. 4 is similar to the magnetic-field generator 32 of FIG. 2 (common elements are designated by the same reference numbers), but further comprises a third conductive portion 32c and a fourth conductive portion 32d. According to this embodiment, the current generator 35 is connected to the third conductive portion 32c. The latter hence comprises the first terminal 32'.

The third conductive portion 32c is connected to the first conductive portion 32a by means of a connection portion 37; the first conductive portion 32a is connected to the fourth conductive portion 32d by means of a connection portion 39; and the fourth conductive portion 32d is connected to the second conductive portion by means of a connection portion 42. The first, second, third, and fourth conductive portions are connected together by means of respective terminal portions so that, in use, the current $i_p$ flows through them, from the terminal 32' of the third conductive portion 32c to the terminal 32" of the second conductive portion 32b (or vice versa), through the first and fourth conductive portions 32a, 32d.

As shown in FIG. 4, in the third conductive portion 32c, the current $i_p$ flows in a direction parallel to the axis Y, whereas in the fourth conductive portion 32d the current $i_p$ flows in a direction perpendicular to the axis X. In this way, in a region corresponding to each of the portions 32c and 32d a respective magnetic field $B_3$ and $B_4$ is generated, having field lines oriented in a direction perpendicular to the direction of flow of the current $i_p$, and hence oriented parallel to the axis X and Y, respectively.

The magnetic-field sensor 50 comprises, unlike the magnetic-field sensor 30 of FIG. 2, four magnetoresistive elements 34a-34d connected to form the Wheatstone bridge 38 (shown in FIG. 4 with a dashed line). In particular, the magnetoresistive elements 34a and 34d are arranged in a position corresponding to the first conductive portion 32a so that their easy axis EA is parallel to the lines of flux of the magnetic field $B_1$ and their hard axis HA is parallel to the lines of flux of the magnetic field $B_2$. The magnetoresistive elements 34b and 34c are instead arranged in a position corresponding to the fourth conductive portion 32d so that their easy axis EA is parallel to the lines of flux of the magnetic field $B_4$ and their hard axis HA is parallel to the lines of flux of the magnetic field $B_3$.

In this way, in use, the set/reset operations are carried out by means of the magnetic fields $B_1$ (for set/reset of the magnetoresistive elements 32a and 32d) and $B_4$ (for set/reset of the magnetoresistive elements 32b and 32c); the operations of calibration/offset compensation are instead carried out by means of the magnetic fields $B_2$ (for calibration/offset compensation of the magnetoresistive elements 32a and 32d) and $B_3$ (for calibration/offset compensation of the magnetoresistive elements 32b and 32c).

It is evident that the second conductive portion 32b must be arranged sufficiently close to the magnetoresistive elements 34a and 34d in order for the magnetic field $B_2$ to have a value such as to enable the required operation to be performed. Likewise, the third conductive portion 32c must be arranged sufficiently close to the magnetoresistive elements 34b and 34c in order for the magnetic field 3 to have a value such as to enable the required operation to be performed. For example, considering an offset current $i_{OFF}$ comprised between 100 mA and 200 mA, the distance d between the third conductive portion 32c and the element that is closer between the magnetoresistive elements 34b, 34c (in this case, the magnetoresistive element 34b) is comprised between 2 µm and 50 µm, for example approximately 10 µm. Said value of distance is preferably respected also as regards the distance between the second conductive portion 32b and the element that is more distant between the magnetoresistive elements 34a, 34d (in this case, the magnetoresistive element 34a). In any case, the value indicated for the distance d is purely indicative and can vary for reasons of optimization of the layout.

Figure 6:
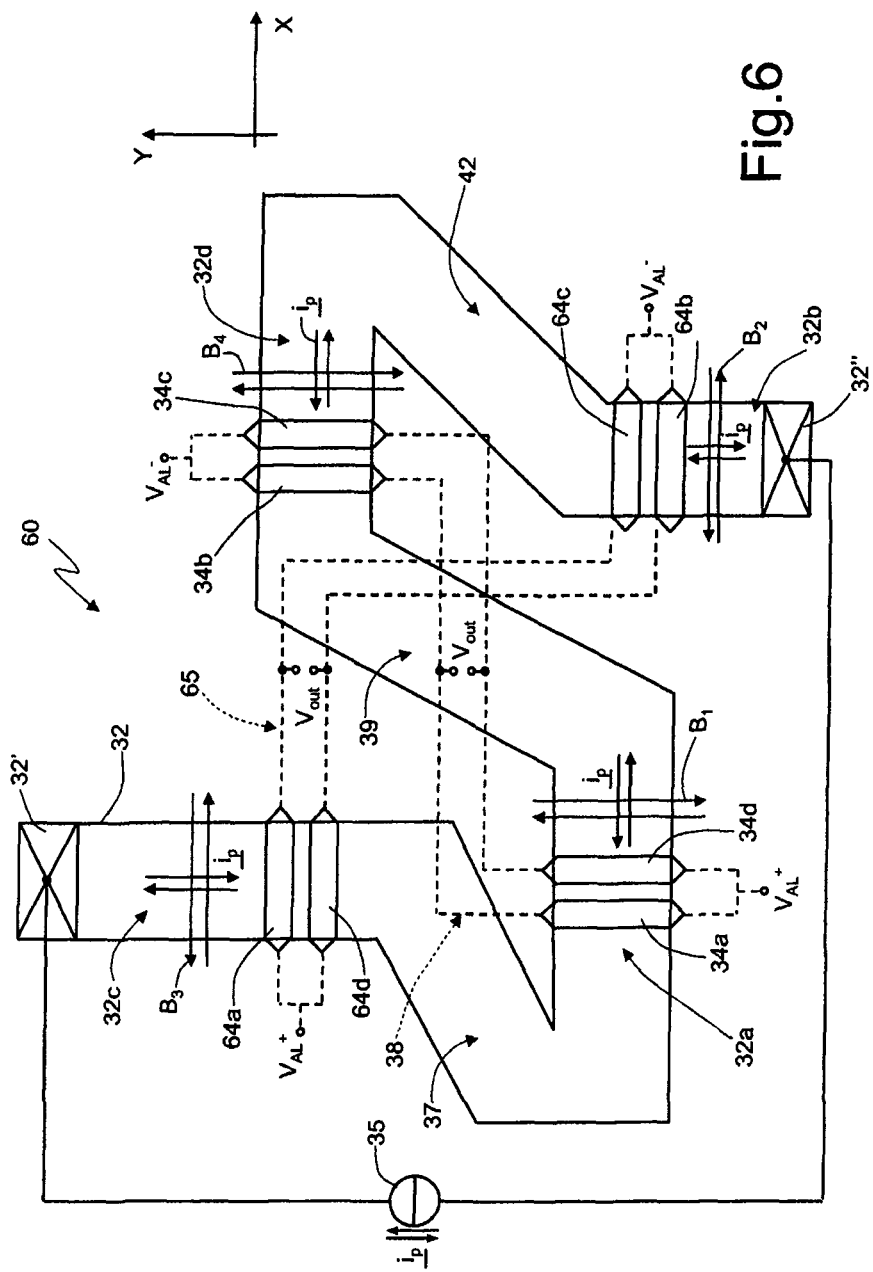
FIG. 6 shows a magnetic-field sensor of the AMR type according to a further embodiment of the present disclosure.

The connection portions 37, 39, and 42 can be provided, for example, in the form of conductive strip, in particular as prolongation of the respective conductive portions 32c, 32a, 32d (for example as shown in FIG. 6).

Figure 5:
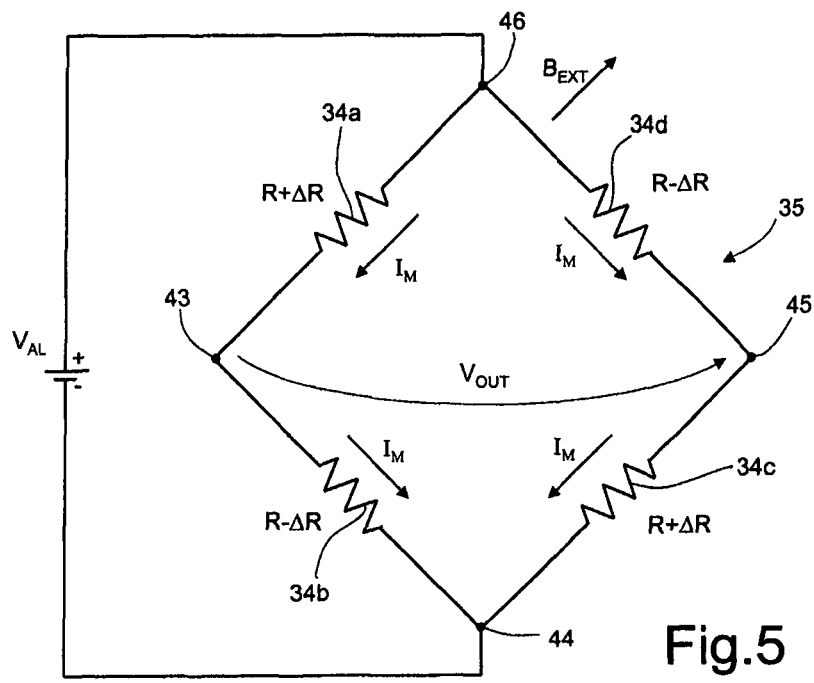
FIG. 5 shows an electrical circuit diagram of a Wheatstone bridge formed by the magnetoresistive elements belonging to the sensor of FIG. 4.

The Wheatstone bridge 38 is shown schematically in FIG. 5.

With reference to FIG. 5, the magnetoresistive elements 34a-34d are interconnected to one another and to pads 43-46. The pad 43 is electrically connected to the magnetoresistive element 34a, and the magnetoresistive element 34a is electrically connected to the magnetoresistive element 34d, with which it shares the pad 46. The magnetoresistive element 34d is electrically connected to the magnetoresistive element 34c, sharing the pad 45. The magnetoresistive element 34c is connected to the magnetoresistive element 34b with which it shares the pad 44. In this way, a resistive Wheatstone-bridge structure 38 is formed that provides a magnetic-field sensor sensitive to components of magnetic field having a component parallel to the hard axis HA.

In use, an input voltage $V_{AL}$ is applied between the pad 44 and the pad 46. Reading of the output voltage $V_{OUT}$ is carried out between the pad 43 and the pad 45.

In particular, the Wheatstone-bridge detection structure 38 includes magnetoresistive elements 34a-34d, which have ideally the same value of resistance and are such as to form diagonal pairs of equal elements, which, in use, react, in a way opposite to one another, to the external magnetic fields, as shown schematically in the figure (where $I_M$ is the electric current that flows in the magnetoresistive elements and R is the common value of resistance).

If a supply voltage $V_{AL}$ is supplied at input to the bridge detection structure, in the presence of an external magnetic field $B_{EXT}$, there occurs a variation of resistance ΔR of the magnetoresistive elements 34a-34d and a corresponding variation of the value of voltage drop on the magnetoresistive elements 34a-34d themselves; in fact, the external magnetic field $B_{EXT}$ determines a variation of the direction of magnetization of the magnetoresistive elements 34a-34d. There follows an unbalancing of the bridge 35, which presents as a variation of voltage ΔV at output from the bridge circuit 35.

Since the direction of the initial magnetization of the magnetoresistive elements is known beforehand, as a function of said voltage variation ΔV it is hence possible to derive the component of the external magnetic field acting in the direction of sensitivity of the magnetic sensor (it thus being possible, using three magnetic sensors with mutually orthogonal directions of sensitivity, to determine magnitude and direction of the external magnetic field itself).

In particular, to detect the unbalancing of the Wheatstone bridge 38 and generate an output signal that indicates the characteristics of the external magnetic field to be measured, a reading circuit (or front-end) is normally used, which is coupled to the output of the bridge 35 and includes, for example, an instrumentation amplifier.

Any possible mismatches in the values of resistance R of the magnetoresistive elements 34a-34d of the Wheatstone bridge 38 generates, as has already been said, an internal offset signal Voff, which affects the accuracy of the output signal Vout.

The operation of offset compensation carried out by generating a magnetic field having components parallel to the hard axis of the magnetoresistive elements 34a-34d has the function of cancelling out or at least reducing said offset signal Voff.

FIG. 6 shows a magnetic-field sensor 60 according to a further embodiment of the present disclosure. In particular, the magnetic-field sensor 60 is a biaxial sensor, configured for detecting external magnetic fields in two directions orthogonal to one another (along the axes X and Y in FIG. 6).

Common elements of the magnetic-field sensor 60 of FIG. 6 and of the magnetic-field sensor 50 of FIG. 4 are not described any further and are designated by the same reference numbers.

The magnetic-field sensor 60 comprises eight magnetoresistive elements 34a-34d and 64a-64d, connected to one another to form a first Wheatstone bridge 38 and a second Wheatstone bridge 65.

In particular, the first Wheatstone bridge 38 is configured for detecting, in use, external magnetic fields acting in the direction defined by the axis X; the second Wheatstone bridge 65 is configured for detecting, in use, external magnetic fields acting in the direction defined by the axis Y.

The magnetoresistive elements 34a-34d and 64a-64d are formed in a known way, and have, according to one embodiment of the present disclosure, a structure of the barber-pole type.

The magnetic-field sensor 60 comprises the magnetic-field generator 32 similar to what has been described with reference to FIG. 4 (in FIG. 6 the connection portions 37, 39, 42 have been illustrated in the form of conductive paths), and hence are not described any further herein.

The magnetic-field generator 32 is configured to carry out both the set/reset operation and the operation of calibration/offset compensation on all the magnetoresistive elements 34a-34d and 64a-64d. For this purpose, the magnetoresistive elements 34a-34d and 64a-64d and the magnetic-field generator 32 are mutually arranged so that the magnetic fields generated by the conductive portions 32a-32d when traversed by a current $i_p$, act on the magnetoresistive elements 34a-34d and 64a-64d both along the preferred axis of magnetization (the easy axis EA) and along the axis of sensitivity (the hard axis HA).

In this way, the magnetic-field generator 32 can be used for carrying out both the set/reset operations and the operations of offset compensation and/or calibration.

The magnetoresistive elements 64a, 64d are arranged in a position corresponding to, and at least partially superimposed on, the third conductive portion 32c, so that their easy axis extends in the direction of the axis X. The magnetoresistive elements 64b, 64c are arranged in a position corresponding to, and at least partially superimposed on, the second conductive portion 32b so that their easy axis extends in the direction of the axis X.

In use, the magnetic field $B_1$, generated by the first conductive portion 32a, is parallel to the easy axis EA of the magnetoresistive elements 34a, 34d and is moreover parallel to the hard axis HA of the magnetoresistive elements 64a, 64d. The magnetic field $B_2$, generated by the second conductive portion 32b, is parallel to the easy axis EA of the magnetoresistive elements 64b, 64c and is moreover parallel to the hard axis HA of the magnetoresistive elements 34a, 34d. The magnetic field $B_3$, generated by the third conductive portion 32c, is parallel to the easy axis EA of the magnetoresistive elements 64a, 64d and is moreover parallel to the hard axis HA of the magnetoresistive elements 34b, 34c. Finally, the magnetic field $B_4$, generated by the fourth conductive portion 32d, is parallel to the easy axis EA of the magnetoresistive elements 34b, 34c and is moreover parallel to the hard axis HA of the magnetoresistive elements 64b, 64c.

The magnetoresistive elements 34a-34d and 64a-64d consequently sense, in use, both a longitudinal magnetic field (along the respective easy axis EA) and a transverse magnetic field (along the respective hard axis HA). The longitudinal magnetic field is used for the operations of set and reset of the magnetoresistive elements 34a-34d and 64a-64d; the transverse magnetic field is used for the operations of calibration and/or offset compensation (and in general the operations carried out by the offset strap in AMR sensors of a known type) of the magnetoresistive elements 34a-34d and 64a-64d.

In order for the local magnetic fields $B_1$-$B_4$ to be such as to enable the operations of calibration/offset compensation of the magnetoresistive elements 34a-34d and 64a-64d set at a distance d from the portions 32a-32d that generate them to be carried out correctly, it is possible to act minimizing said distance d (as already discussed with reference to FIG. 4) or else increasing the values of the magnetic fields generated. To minimize the consumption levels the first solution is preferable.

Figure 7:
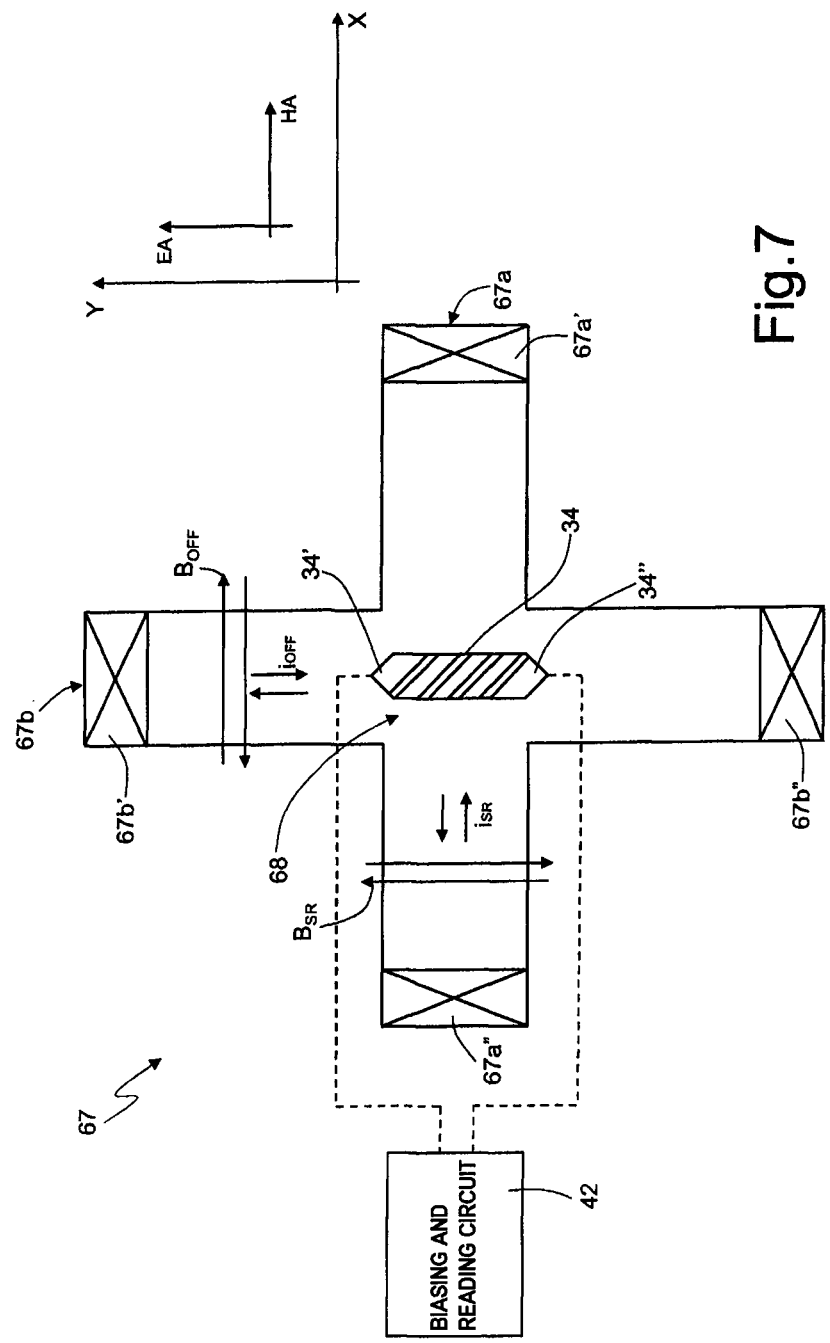
FIG. 7 shows a magnetic-field sensor of the AMR type according to another embodiment of the present disclosure.

FIG. 7 shows a further embodiment of a magnetic-field sensor 66 according to the present disclosure.

The magnetic-field sensor 66 comprises a magnetic-field generator 67, here in particular formed by a first planar conductive strip 67a and a second planar conductive strip 67b, which are electrically coupled in an intersection portion 68. Set in a position corresponding to the intersection portion 68 is a magnetoresistive element 34 (for example, of the type shown and described in FIG. 3), with the easy axis EA parallel to the axis Y and the hard axis HA parallel to the axis X.

The magnetoresistive element 34 can be formed as a single strip of ferromagnetic material (for example, deposited thin films comprising an Ni/Fe alloy), typically in a barber-pole configuration, or as a plurality of sub-elements of ferromagnetic material, for example in the form of strips. In the case where each magnetoresistive element is formed by a plurality of sub-elements of ferromagnetic material, said sub-elements are connected together in series.

The magnetic-field generator 67 is configured for carrying out both the operation of set/reset and the operation of calibration/offset compensation of the magnetoresistive element 34. The magnetic-field generator 67 can hence be operated indifferently with the purpose of set/reset (as described with reference to the strap 20 of FIG. 1) or with the purpose of calibration during the testing stage or offset compensation (as described with reference to the strap 19 of FIG. 1), or simultaneously with both purposes of set/reset and calibration/offset compensation.

The first and second conductive strips 67a, 67b lie in the same plane XY and are hence coplanar. In particular, the first and second conductive strips 67a, 67b are made of metal material (for example, aluminum, copper, gold, etc.) and are formed in one and the same metal level.

The first conductive strip 67a comprises a first terminal 67a' and a second terminal 67a", which are arranged at opposite ends, along the axis X, of the first conductive strip 67a, and can be coupled to a current generator (not shown); likewise, the second conductive strip 67b comprises a first terminal 67b' and a second terminal 67b", which are arranged at opposite ends, along the axis Y, of the second conductive strip 67b, and can be coupled to a current generator (not shown). In this way, in use, a set/reset current $i_{SR}$ can be made to flow between the terminals 67a' and 67a" parallel to the axis X (in both directions), generating a set/reset magnetic field $B_{SR}$ having lines of flux parallel to the easy axis EA of the magnetoresistive element 34; and a calibration/offset-compensation current $i_{OFF}$ can be made to flow between the terminals 67b' and 67b" parallel to the axis Y (in both directions), generating a magnetic field $B_{OFF}$ having lines of flux parallel to the hard axis HA of the magnetoresistive element 34.

The magnetoresistive element 34 is disposed electrically insulated from the magnetic-field generator 67 in an area at least partially overlying, or underlying, the intersection portion 68, and in any case so as to sense the magnetic fields $B_{SR}$ and $B_{OFF}$ generated by the conductive strips 67a, 67b when these are traversed by a current pulse $i_{SR}$ and, respectively, $i_{OFF}$.

During the set/reset operation, the terminals 67a' and 67a" of the first conductive strip 67a are connected to a current generator for causing flow of the current $i_{SR}$, and the terminals 67b' and 67b" of the second conductive strip 67b are maintained at high impedance; instead, during the operation of calibration/offset compensation, the terminals 67b' and 67b" of the second conductive strip 67b are connected to a current generator for causing flow of the current $i_{OFF}$, and the terminals 67a' and 67a" of the first conductive strip 67a are maintained at high impedance.

Biasing of the conductive strips 67a, 67b for the set and reset operations occurs with a current $i_{SR}$ typically comprised between 200 mA and 1 A; the operations of calibration are typically carried out by generating a current $i_{OFF}$ typically comprised between 5 but and 50 mA. However, on the basis of the type of the magnetoresistive elements used, said values can be different, higher or lower than the intervals indicated.

FIG. 8 shows a further embodiment of a magnetic-field sensor 70 according to the present disclosure.

According to the embodiment of FIG. 8, the magnetic-field generator is similar to the magnetic-field generator described with reference to FIG. 7, but comprises a plurality of (in particular, more than two) conductive elements, for example in the form of coplanar conductive strips, for example metal strips, formed in the same metal level. The conductive strips extend in directions X and Y orthogonal to one another and intersect in intersection points, to form a grid 99.

The operations of set/reset and of calibration/offset compensation of the magnetoresistive elements of the magnetic-field sensor 70 are carried out by appropriately biasing the grid 99 of conductive strips.

The magnetic-field sensor 70 comprises, in particular, six conductive strips 112a-112f, arranged to form the grid 99. The conductive strips 112a-112c extend in a main direction of extension parallel to the axis X, whereas the conductive strips 112d-112f extend in a main direction of extension parallel to the axis Y.

Arranged, in pairs, at some between the points of intersection of the conductive strips 112a-112f are magnetoresistive elements 114a-114d (connected to one another to form a first Wheatstone bridge 115, in which the connections are represented in the figure by a solid line) and magnetoresistive elements 116a-116d (which are also connected to one another to form a second Wheatstone bridge 117, in which the connections are represented in the figure by a dashed line). In particular, the magnetoresistive elements 114a and 114d are arranged at the intersection between the conductive strips 112a and 112e, and are oriented so that their easy axis EA is orthogonal to the main direction of extension of the conductive strip 112a (i.e., orthogonal to the axis X), and their hard axis HA is orthogonal to the main direction of extension of the conductive strip 112e (i.e., orthogonal to the axis Y).

The magnetoresistive elements 114b and 114c are arranged at the intersection between the conductive strips 112c and 112e, and are oriented as the magnetoresistive elements 114a, 114d, i.e., so that their easy axis EA is orthogonal to the main direction of extension of the conductive strip 112a, and their hard axis HA is orthogonal to the main direction of extension of the conductive strip 112e.

In use, for the set/reset operations, a current $i_{SR}$ flows in the conductive strip 112a and 112c in the direction defined by the axis X (with opposite senses for the set and reset operations), generating a magnetic field $B_{SR}$ having a field component along the axis Y; for the operations of calibration/offset compensation, a current $i_{OFF}$ flows in the conductive strip 112e in the direction defined by the axis Y, generating a respective magnetic field $B_{OFF}$ having a component along the axis X.

Figure 9B:
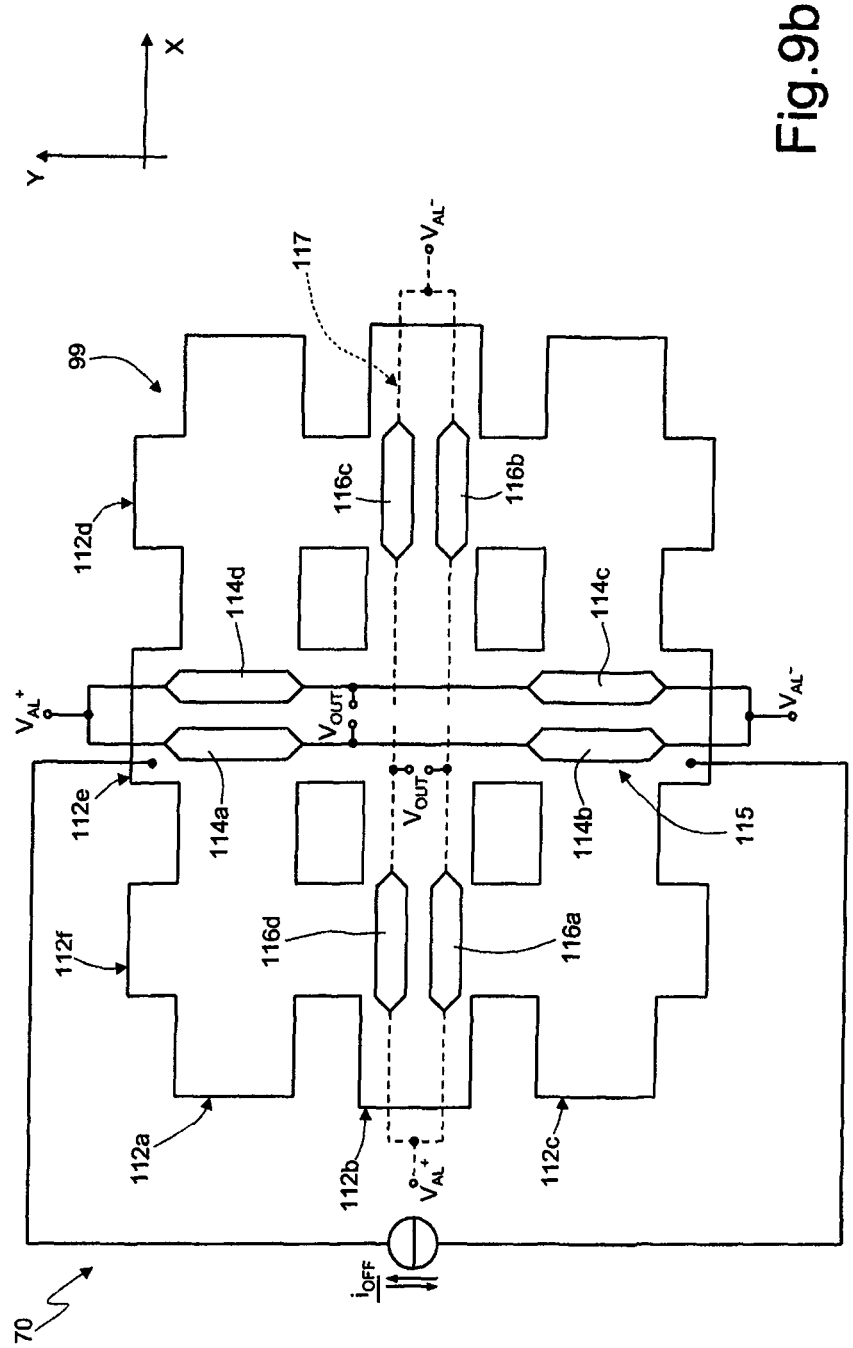

Since the magnetoresistive elements 114a-114d belong to the same Wheatstone bridge 115, the set/reset operations are carried out simultaneously for all the magnetoresistive elements 114a-114d (situation illustrated in FIG. 9a) by appropriately biasing the conductive strips 112a and 112c. The other conductive strips 112b and 112d-112f are kept at high impedance.

In addition, since the magnetoresistive elements 114a-114d share the same conductive strip 112e, also the operation of calibration/offset compensation is carried out simultaneously for all the magnetoresistive elements 114a-114d (situation illustrated in FIG. 9b) by appropriately biasing the conductive strip 112e. The other conductive strips 112a-112d and 112f are kept at high impedance.

Likewise, the magnetoresistive elements 116a and 116d are arranged at the intersection between the conductive strips 112b and 112f, whilst the magnetoresistive elements 116b and 116c are arranged at the intersection between the conductive strips 112b and 112d, and hence share the conductive strip 112b. The magnetoresistive elements 116a-116d are oriented so that their easy axis EA is orthogonal to the main direction of extension of the respective conductive strip 112d, 112f (i.e., orthogonal to the axis Y), and their hard axis HA is orthogonal to the main direction of extension of the conductive strip 112b (i.e., orthogonal to the axis X).

In use, for the set/reset operations, a current $i_{SR}$ flows in the conductive strips 112d and 112f, in the direction defined by the axis Y (with opposite senses for the set and reset operations), generating a respective magnetic field $B_{SR}$ along the axis X such as to force the orientation of the magnetic dipoles of the magnetoresistive elements 116a-116d; for the operations of calibration/offset compensation, the current $i_{OFF}$ flows in the conductive strip 112b in the direction defined by the axis X, generating a respective magnetic field $B_{OFF}$ along the axis Y.

Figure 9C:
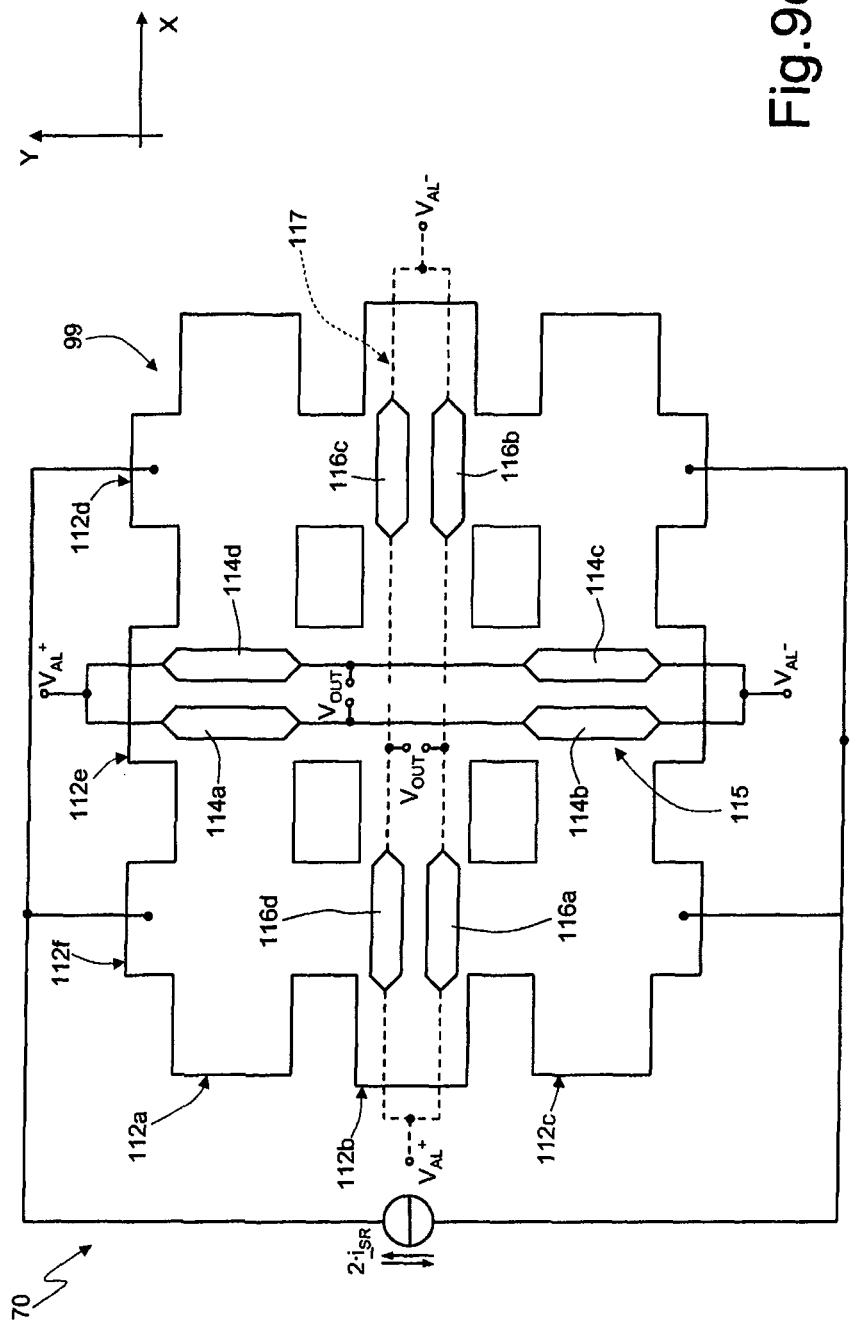
Figure 9D:
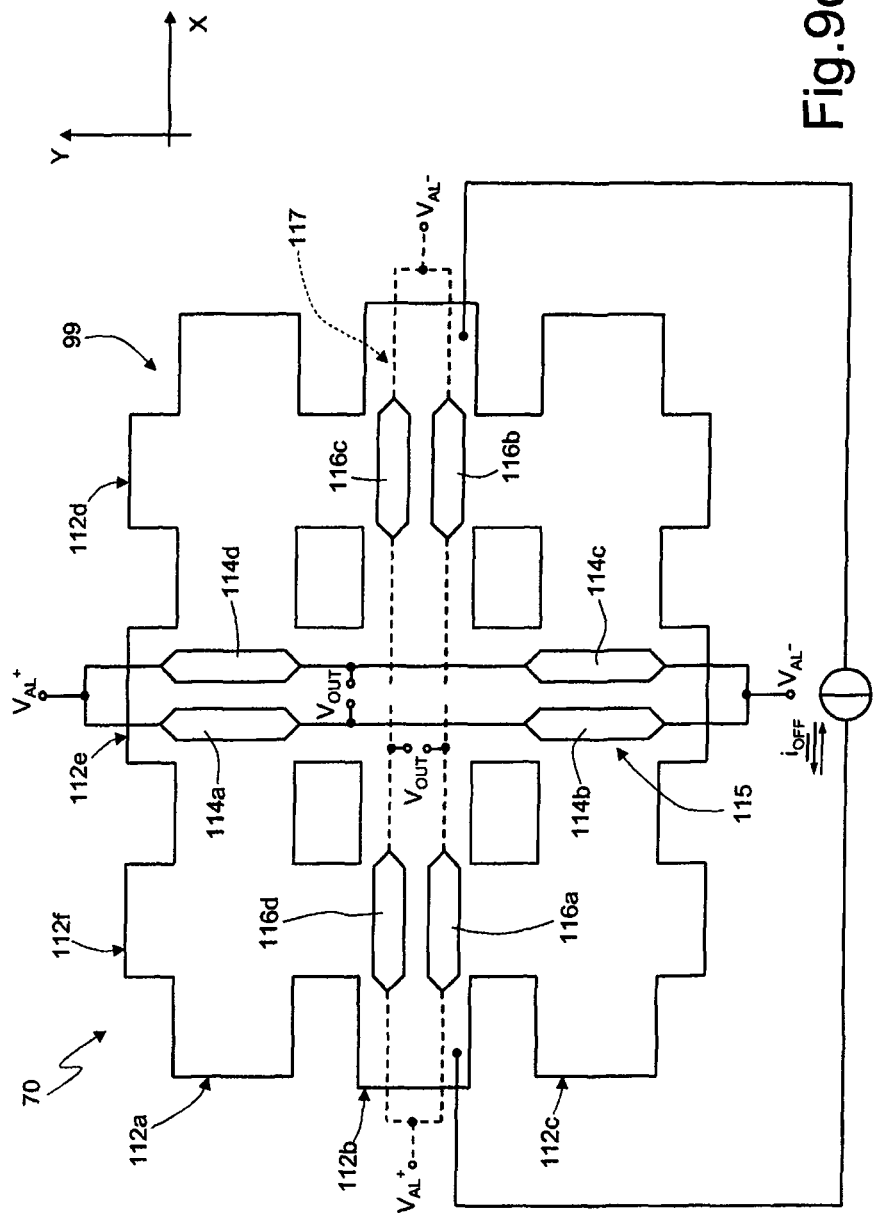

Since the magnetoresistive elements 116a-116d belong to the same Wheatstone bridge 117, the set/reset operations are carried out simultaneously for all the magnetoresistive elements 116a-116d (situation illustrated in FIG. 9c) by appropriately biasing the conductive strips 112d and 112f. The others conductive strips 112a-112c and 112e are kept at high impedance.

In addition, since the magnetoresistive elements 116a-116d share the same conductive strip 112b, also the operation of calibration/offset compensation is carried out simultaneously for all the magnetoresistive elements 116a-116d (situation illustrated in FIG. 9b) by appropriately biasing the conductive strip 112b. The other conductive strips 112a and 112c-112f are kept at high impedance.

Biasing of the conductive strips for the set and reset operations occurs with a current $i_{SR}$ typically comprised between 200 mA and 1 A; the operations of calibration are typically carried out by generating a current $i_{OFF}$ typically comprised between 5 but and 50 mA.

However, on the basis of the type of magnetoresistive elements used, said values can be different, higher or lower than the intervals indicated.

The embodiments of FIGS. 7 and 8 are advantageous as compared to the embodiments of FIGS. 2, 4 and 6 in so far as they are more efficient and use lower offset-compensation currents $i_{OFF}$.

According to an alternative embodiment (not shown in the figure), the magnetic-field sensor 70 of FIG. 8 comprises just the Wheatstone bridge 115. In this case, the conductive strips 112b, 112d, 112f are not necessary and the sensor thus formed is a uniaxial sensor, sensitive to external magnetic fields having lines of force along the axis X.

According to a further embodiment (not shown in the figure), the magnetic-field sensor 70 of FIG. 8 comprises just the Wheatstone bridge 117. In this case, the conductive strips 112a, 112c, 112e are not necessary and the sensor thus formed is a uniaxial sensor, sensitive to external magnetic fields having lines of force along the axis Y.

Irrespective of the embodiment of the magnetic-field sensor, the latter can be implemented in integrated form in an ASIC chip or on a chip separated from the ASIC chip and connected to the ASIC chip by means of bump connections. The ASIC chip comprises, in a known way, a plurality of active and/or passive electronic components integrated in the substrate. In particular, the electronic components form a supply and/or reading circuit in a magnetic-field sensor (for example, the circuit 42 of FIGS. 2 and 3). The ASIC is configured for supplying to the magnetoresistive elements (in particular, to the input terminals of each Wheatstone bridge) an input signal $V_{AL}$ designed to bias the magnetoresistive elements of the magnetic-field sensor. The ASIC is moreover configured for reading an output signal $V_{OUT}$ generated by the magnetoresistive elements (in particular, at the output terminals of each Wheatstone bridge) in response to the input signal $V_{AL}$ and to a (possible) external magnetic field to be detected.

The power-supply and reading ASIC is of a known type and comprises, for example, a resistive or switched-capacitor differential or fully differential front ends, or in any case any circuit known in the literature designed to read differential signals generated by a Wheatstone bridge.

As has been said, according to one embodiment, the magnetic-field sensor (comprising the magnetoresistive elements and the magnetic-field generator) is implemented in integrated form in a substrate different from the substrate of the ASIC chip, and can be connected to the ASIC by means of bumps. For this purpose, the substrate of the ASIC and the substrate of the chip that carries the magnetic-field sensor have on the surface a respective plurality of pads configured for acting as interface between the ASIC and the magnetoresistive elements and the strap.

According to a further embodiment, the magnetic-field generator and the magnetoresistive elements are implemented in integrated form in respective top metal levels of the ASIC chip. For example, the magnetoresistive elements are formed in the last metal level of the ASIC chip, and the magnetic-field generator is formed in the immediately underlying metal level. According to this embodiment, bumps or other connection elements between chips are not necessary, with the advantage of reducing the parasitic capacitance.

Figure 10:
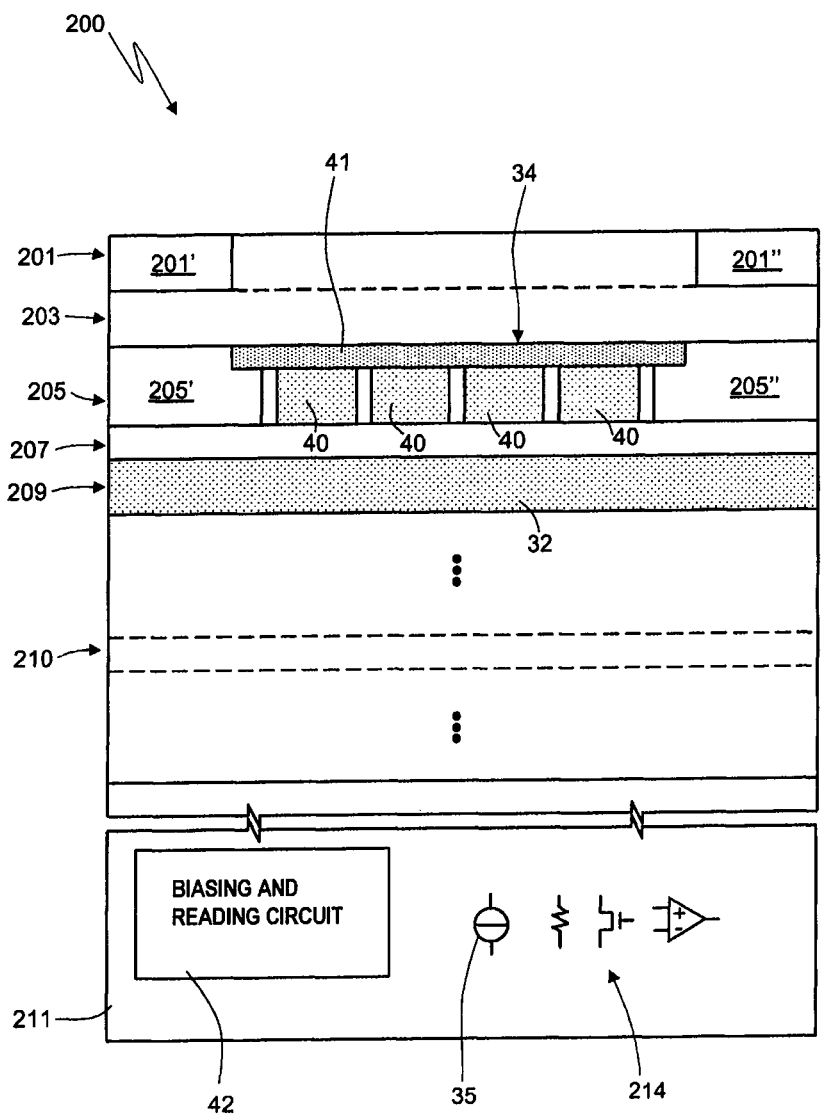
FIG. 10 shows a cross-sectional view provided by way of example of a magnetic-field sensor of an integrated type according to any one of the embodiments of the present disclosure.
Figure 11:
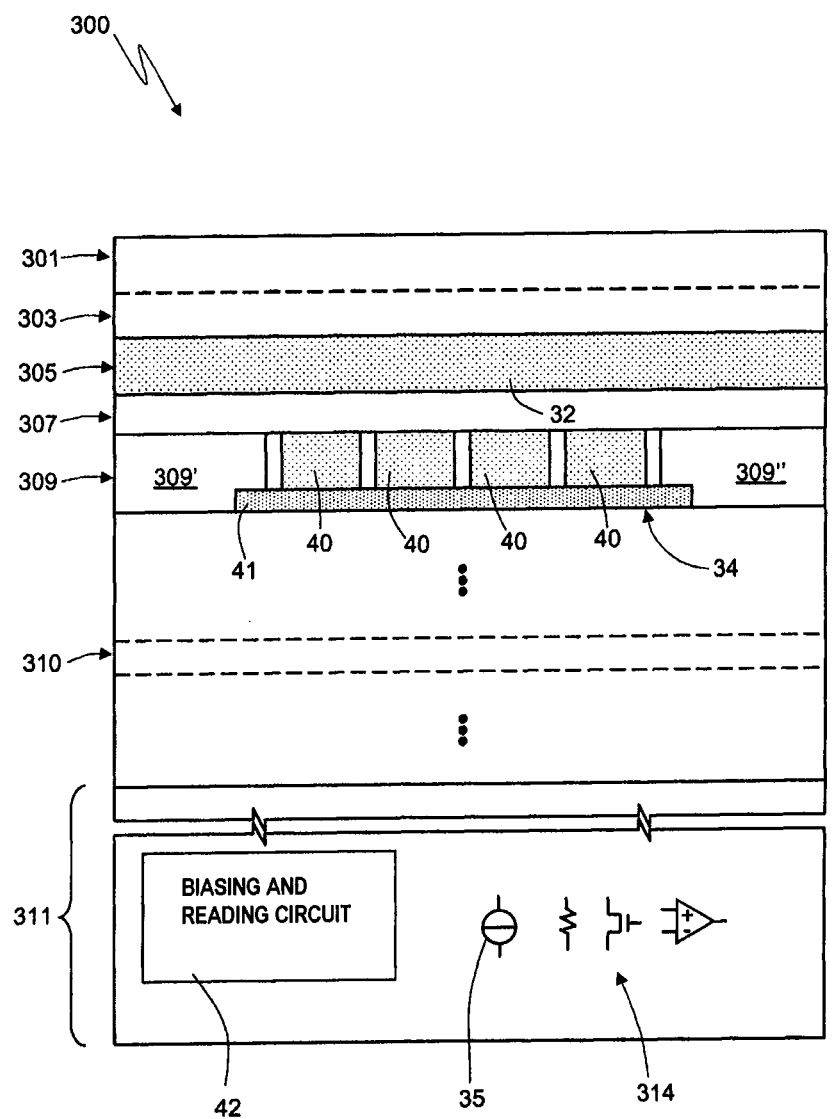
FIG. 11 shows a cross-sectional view provided by way of example of a magnetic-field sensor of an integrated type according to an embodiment alternative to the one shown in FIG. 10.

This latter embodiment is shown by way of example in FIGS. 10 and 11, which are alternative to one another.

FIG. 10 shows a cross-sectional view of a portion of a chip 200 comprising a magnetic-field sensor according to any of the embodiments of the present disclosure.

The chip 200 comprises a layer 201 for interface towards the outside world, for example obtained by passivation technique. The passivation layer 201 (made, for example, of silicon oxide with a thickness of some micrometers) houses possible conductive connections 201' and 201" (for example, metal conductive pads).

Extending underneath the passivation layer 201 is an insulation layer 203. The insulation layer 203 is made of dielectric material (e.g., silicon oxide) and houses a plurality of vias (not shown). Extending beyond the insulation layer 203 is a layer 205 comprising oxides and metals, housing conductive connections 205' and 205" (with reference to FIG. 3, the connections 205' and 205" are, for example, the connections that connect the biasing and reading circuit 42 to the terminals 34' and 34" of the magnetoresistive element 34). The layer 205 moreover houses the magnetoresistive elements (just one magnetoresistive element 34 is indicated by way of example in the figure). The magnetoresistive element 34 comprises the portion made of ferromagnetic material 41 (which, as has been said, is typically an Ni/Fe alloy, with a thickness of some tens of nanometers) and the barber-pole structure 40 (which is, for example, made of copper and has a thickness of some hundreds of nanometers). The portion made of ferromagnetic material 41 and the barber-pole structure 40 are in ohmic contact with one another.

Extending underneath the layer 205 is a second insulation layer 207 of dielectric material, which houses one or more conductive vias (not shown in the figure).

Then, extending underneath the second insulation layer 207 is a metal layer 209, which houses the magnetic-field generator 32. The magnetic-field generator 32 has, for example, a thickness comprised between some hundreds of nanometers and some micrometers (even 10 μm or more). The metal layer 209 can moreover house further connection elements and/or metal paths, to form connections between the top layers and the bottom layers.

Underneath the second metal layer there may be present further insulation layers and metal layers (designated as a whole by the reference number 210) and a substrate 211, provided in which are generic electronic components (for example, the biasing and reading circuit 42, the current generator 35), as well as all the circuitry for supporting reading of the sensor such as for example, reading front-ends, ADCs, reference current and voltage generators, control logic, filters, memories (designated as a whole by the reference number 214).

FIG. 11 shows a cross-sectional view of a portion of a chip 300 according to an embodiment alternative to that of FIG. 10. The chip 300 houses a magnetic-field sensor according to any one of the embodiments of the present disclosure.

The chip 300 comprises a layer 301 for interface towards the outside world, for example obtained by passivation technique. The passivation layer 301 (made, for example, of silicon oxide with a thickness of some micrometers) houses possible conductive connections 301' and 301" (for example, metal conductive pads).

Extending underneath the passivation layer 301 is an insulation layer 303. The insulation layer 303 is made of dielectric material (e.g., silicon oxide) and houses a plurality of vias (not shown). Extending beyond the insulation layer 303 is a metal layer 305, which houses the magnetic-field generator 32. The magnetic-field generator 32 has, for example, a thickness comprised between some hundreds of nanometers and some micrometers (even 10 μm or more). The metal layer 305 can moreover house further connection elements and/or metal paths, to form connections between the top layers and the bottom layers (not shown).

Extending underneath the metal layer 305 is a second insulation layer 307 of dielectric material, which can house one or more conductive vias (not shown).

Then, extending underneath the second insulation layer 307 is a layer 309 comprising oxides and metals, and in particular housing conductive connections 309' and 309" (with reference to FIG. 3, said connections 309' and 309" are, for example, the connections that connect the biasing and reading circuit 42 to the terminals 34' and 34" of the magnetoresistive element 34).

The layer 309 moreover houses the magnetoresistive elements (just one magnetoresistive element 34 is indicated by way of example in the figure). The magnetoresistive element 34 comprises the portion made of ferromagnetic material 41 (which, as has been said, is typically a Ni/Fe alloy, with a thickness of some tens of nanometers) and the barber-pole structure 40 (which is, for example, made of copper and has a thickness of some hundreds of nanometers). The portion made of ferromagnetic material 41 and the barber-pole structure 40 are in ohmic contact with one another.

Underneath the layer 309 there may be present further insulation layers and/or metal layers (designated as a whole by the reference number 310) and a substrate 311, in which generic electronic components are provided (for example, the biasing and reading circuit 42, the current generator 35), as well as all the circuitry for supporting reading of the sensor such as for example, reading front-ends, ADCs, reference current and voltage generators, control logic, filters, memories (designated as a whole by the reference number 314).

Alternatively, it is also possible to form the magnetoresistive elements and the magnetic-field generator in layers different from the ones shown, either above or below.

From an examination of the characteristics according to the present disclosure the advantages that it affords are evident.

In particular, a single metal level can be used to form the magnetic-field generator for the operations of set, reset, calibration, testing, offset compensation, etc., thus enabling reduction of the masks for the fabrication of the magnetic-field sensor, and consequently reducing the manufacturing costs.

Finally, it is clear that modifications and variations may be made to the disclosure described and illustrated herein, without thereby departing from the sphere of protection of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all the possible embodiments along with the full scope of equivalents to which such claims are entitled. Accordingly, the claims are not limited by the disclosure.

The invention claimed is:

1. An integrated magnetic-field sensor to detect an external magnetic field, comprising:
    a first magnetoresistive structure configured to detect said external magnetic field, the first magnetoresistive structure having a main axis of magnetization and a secondary axis of magnetization orthogonal to one another, the first magnetoresistive structure including:
        a first magnetoresistive element having a length and width that are substantially parallel to the main and secondary axes of magnetization, respectively; and
    a magnetic-field generator including:
        a first portion extending longitudinally in a first plane and configured to generate a first magnetic field having field lines along a first field direction that is parallel to the main axis of magnetization; and
        a second portion extending longitudinally in the first plane, electrically coupled to the first portion, and configured to generate a second magnetic field having field lines along a second field direction that is parallel to the secondary axis of magnetization, the second portion being physically separate and spaced apart from the first portion, the first magnetoresistive element being configured to be magnetized by the first magnetic field along the main axis of magnetization and to be magnetized by the second magnetic field along the secondary axis of magnetization.

2. The sensor according to claim 1, wherein the first magnetoresistive structure extends longitudinally in a second plane, parallel to the first plane, extends at a distance from the first portion, and is at least partially aligned with the first portion in a direction orthogonal to said first and second planes.

3. The sensor according to claim 2, wherein the second portion of the magnetic-field generator is arranged at a distance, along a direction parallel to said first and second planes, the second portion being between 2 μm and 50 μm from the first magnetoresistive structure so that the second magnetic field is applied to the first magnetoresistive structure.

4. The sensor according to claim 1, wherein:
    the first portion is a first conductive strip that is coupled to a first conduction terminal; and
    the second portion is a second conductive strip that is coupled to a second conduction terminal, the first conduction terminal and the second conduction terminal being configured to be biased and generate an electric current that flows through the first and second conductive strips in first and second directions of conduction, respectively, said first magnetic field direction being orthogonal to the first direction of conduction, said second magnetic field direction being orthogonal to the second direction of conduction.

5. The sensor according to claim 1, wherein the first magnetoresistive structure includes second, third, and fourth magnetoresistive elements, the first, second, third, and fourth magnetoresistive elements being coupled to one another to form a Wheatstone bridge.

6. The sensor according to claim 5, wherein:
the first, second, third, and fourth magnetoresistive elements have respective main axes of magnetization and respective secondary axes of magnetization;
the magnetic-field generator includes a third portion configured to generate a third magnetic field having field lines along the second field direction, and a fourth portion configured to generate a fourth magnetic field having field lines along the first field direction, the first, second, third, and fourth portions each extending longitudinally in the first plane and being coupled to one another;
the first and second magnetoresistive elements and the first portion are mutually arranged so that the first portion is configured to apply the first magnetic field to the first and second magnetoresistive elements along their main axes of magnetization;
the first and second magnetoresistive elements and the second portion are mutually arranged so that the second portion is configured to apply the second magnetic field to the first and second magnetoresistive elements along their secondary axes of magnetization;
the third and fourth magnetoresistive elements and the fourth portion are mutually arranged so that the fourth portion is configured to apply the fourth magnetic field to the third and fourth magnetoresistive elements along their main axes of magnetization; and
the third and fourth magnetoresistive elements and the third portion are mutually arranged so that the third portion is configured to apply the third magnetic field to the third and fourth magnetoresistive elements along their secondary axes of magnetization.

7. The sensor according to claim 6, wherein the first, second, third, and fourth magnetoresistive elements extend in a second plane that is parallel to the first plane, said first and second magnetoresistive elements being at least partially aligned to the first portion along an orthogonal direction that is orthogonal to the first and second planes, and said third and fourth magnetoresistive elements being at least partially aligned to the fourth portion along said orthogonal direction.

8. The sensor according to claim 1, wherein the first and second portions comprise strips of conductive material electrically connected together, said first and second portions forming an open polygonal chain.

9. The sensor according to claim 1, further comprising a second magnetoresistive structure configured to detect said external magnetic field, the second magnetoresistive detection structure having a main axis of magnetization and a secondary axis of magnetization, said second magnetoresistive structure being configured so that the main axis of magnetization of the second magnetoresistive structure extends orthogonally to the main axis of magnetization of the first magnetoresistive structure.

10. The sensor according to claim 9, wherein:
the first magnetoresistive structure extends longitudinally in a second plane, parallel to the first plane, extends at a distance from the magnetic-field generator, and is at least partially aligned with the magnetic-field generator in an orthogonal direction that is orthogonal to said first and second planes; and
the second magnetoresistive structure extends longitudinally in the second plane and arranged at a distance from and at least partially aligned, along said orthogonal direction, to the magnetic-field generator.

11. The sensor according to claim 9, wherein:
the first magnetoresistive structure extends longitudinally in a second plane, parallel to the first plane, extends at a distance from the magnetic-field generator, and is at least partially aligned with the magnetic-field generator in an orthogonal direction that is orthogonal to said first and second planes;
the first magnetoresistive structure includes second, third, and fourth magnetoresistive elements, the first, second, third, and fourth magnetoresistive elements being coupled to one another to form a first Wheatstone bridge; and
the second magnetoresistive structure includes fifth, sixth, seventh, and eighth magnetoresistive elements that are arranged coplanar to the first magnetoresistive structure and are arranged at a distance from and at least partially aligned, in said orthogonal direction, to the magnetic-field generator, the fifth, sixth, seventh, and eighth magnetoresistive elements being coupled to one another to form a second Wheatstone bridge.

12. The sensor according to claim 1, wherein the first magnetoresistive structure includes first and second conduction terminals, the sensor further comprising:
a supply circuit configured to supply the first magnetoresistive structure and generate a flow of electric current between the first and second conduction terminals of said first magnetoresistive structure; and
a reading circuit configured to detect a variation of electrical resistance of the first magnetoresistive structure.

13. The sensor according to claim 1, wherein the magnetic-field generator is configured to carry out operations of set, reset, calibration, and offset compensation of the first magnetoresistive structure.

14. An integrated magnetic-field sensor to detect an external magnetic field, comprising:
a first magnetoresistive structure configured to detect said external magnetic field, the first magnetoresistive structure having a main axis of magnetization and a secondary axis of magnetization orthogonal to one another, the first magnetoresistive structure including a first magnetoresistive element; and
a magnetic-field generator including:
a first portion extending longitudinally in a first plane and configured to generate a first magnetic field having field lines along a first field direction that is parallel to the main axis of magnetization; and
a second portion extending longitudinally in the first plane, the second portion intersects the first portion in the first plane to form a first area of intersection, the second portion configured to generate a second magnetic field having field lines along a second field direction that is parallel to the secondary axis of magnetization, wherein the first magnetoresistive element positioned over the first area of intersection and electrically insulated from the first portion and from the second portion.

15. The sensor according claim 14, wherein the first portion of the magnetic-field generator includes a first conduction terminal and a second conduction terminal, and the second portion of the magnetic-field generator includes a third conduction terminal and a fourth conduction terminal, the first and second conduction terminals being configured to be biased to generate in said first portion an electric current that flows along a first direction of conduction, the third and fourth conduction terminals being configured to be biased to generate in said second portion an electric current that flows along a second direction of conduction orthogonal to the first direction of conduction, said first field direction being orthogonal to the first direction of conduction, said second field direction being orthogonal to the second direction of conduction.

16. The sensor according to claim 14, wherein:
the magnetic-field generator includes a third portion extending longitudinally in the first plane and configured to generate a third magnetic field having field lines in the second field direction, the third portion extending longitudinally parallel to the second portion and the third portion intersects the first portion in a second area of intersection, and
the first magnetoresistive structure includes second, third, and fourth magnetoresistive elements, the first, second, third, and fourth magnetoresistive elements extending in a second plane parallel to and at a distance from the first plane in a direction orthogonal to the first and second planes, said first and second magnetoresistive elements being at least partially aligned, along said orthogonal direction, to the first area of intersection, and said third and fourth magnetoresistive elements being at least partially aligned, along said orthogonal direction, to the second area of intersection.

17. An integrated magnetic-field sensor to detect an external magnetic field, comprising:
a first magnetoresistive structure configured to detect said external magnetic field, the first magnetoresistive structure having a main axis of magnetization and a secondary axis of magnetization orthogonal to one another;
a magnetic-field generator including:
a first portion extending longitudinally in a first plane and configured to generate a first magnetic field having field lines along a first field direction that is parallel to the main axis of magnetization of the first magnetoresistive structure; and
a second portion extending longitudinally in the first plane, coupled to the first portion, and configured to generate a second magnetic field having field lines along a second field direction that is parallel to the secondary axis of magnetization of the first magnetoresistive structure, the first magnetoresistive structure extending longitudinally in a second plane that is parallel to the first plane, the first magnetoresistive structure extending at a distance from the first portion, the first magnetoresistive structure being at least partially aligned with the first portion in an orthogonal direction that is orthogonal to said first and second planes; and
a second magnetoresistive structure configured to detect said external magnetic field, the second magnetoresistive detection structure having a main axis of magnetization and a secondary axis of magnetization, said second magnetoresistive structure being configured so that the main axis of magnetization of the second magnetoresistive structure extends orthogonally to the main axis of magnetization of the first magnetoresistive structure, the second magnetoresistive structure including a first magnetoresistive element that extending longitudinally in the second plane and arranged at a distance from and at least partially aligned, along said orthogonal direction, to the magnetic-field generator.

18. The sensor according to claim 17, wherein:
the first magnetoresistive structure includes second, third, fourth, and fifth magnetoresistive elements that are coupled to one another to form a first Wheatstone bridge; and
the second magnetoresistive structure includes sixth, seventh, and eight magnetoresistive elements, the first, sixth, seventh, and eight magnetoresistive elements being coupled to one another to form a second Wheatstone bridge, the second magnetoresistive structure being coplanar to the first magnetoresistive structure, said sixth, seventh, and eighth magnetoresistive elements being arranged at a distance from and at least partially aligned, in said orthogonal direction, to the magnetic-field generator.

19. A device, comprising:
an integrated magnetic-field sensor to detect an external magnetic field, the sensor including:
a first magnetoresistive structure configured to detect said external magnetic field, the first magnetoresistive structure having a first axis of magnetization that is orthogonal to a second axis of magnetization; and
a magnetic-field generator including:
a first portion extending longitudinally in a first plane and configured to generate a first magnetic field having field lines along a first field direction that is parallel to the first axis of magnetization, the first portion configured to set or reset the first magnetoresistive structure with the first magnetic field; and
a second portion extending longitudinally in the first plane, coupled to the first portion, and configured to generate a second magnetic field having field lines along a second field direction that is parallel to the second axis of magnetization, the second portion configured to calibrate or offset the first magnetoresistive structure with the second magnetic field.

20. The sensor according to claim 19, wherein the first portion and the second portion of the magnetic-field generator are electrically coupled to one another in a first area of intersection, the first magnetoresistive element being at least partially arranged in a position above the first area of intersection and electrically insulated from the first portion and from the second portion.

21. The sensor according claim 20, wherein the first portion of the magnetic-field generator comprises a first conduction terminal and a second conduction terminal, and the second portion of the magnetic-field generator comprises a third conduction terminal and a fourth conduction terminal, the first and second conduction terminals being configured to be biased so as to generate in said first portion an electric current that flows along a first direction of conduction, the third and fourth conduction terminals being configured to be biased so as to generate in said second portion an electric current that flows along a second direction of conduction orthogonal to the first direction of conduction, said first field direction being orthogonal to the first direction of conduction, said second field direction being orthogonal to the second direction of conduction.

22. The sensor according to claim 20, wherein:
the magnetic-field generator comprises a third portion extending longitudinally in the first plane and configured to generate a third magnetic field having field lines in the second field direction, the third portion extending longitudinally parallel to the second portion and intersecting the first portion in a second area of intersection; and
the first magnetoresistive structure includes second, third, and fourth magnetoresistive elements, the first, second, third, and fourth magnetoresistive elements extending in a second plane parallel to and at a distance from the first plane in a direction orthogonal to the first and second planes, said first and second magnetoresistive elements being at least partially aligned, along said orthogonal direction, to the first area of intersection, and said third and fourth magnetoresistive elements being at least partially aligned, along said orthogonal direction, to the second area of intersection.

23. The device according to claim 19, wherein:

the first portion is a first conductive strip that is coupled to a first conduction terminal; and the second portion is a second conductive strip that is coupled to a second conduction terminal, the first conduction terminal and the second conduction terminal being configured to be biased to generate an electric current that flows through the first and second conductive strips in first and second directions of conduction, respectively, said first magnetic field direction being orthogonal to the first direction of conduction, said second magnetic field direction being orthogonal to the second direction of conduction.

24. The device according to claim 19, wherein the first magnetoresistive structure extends longitudinally in a second plane, parallel to the first plane, and is at least partially aligned with the magnetic-field generator in an orthogonal direction that is orthogonal to the first and second planes, the sensor further comprising:

a second magnetoresistive structure that extends longitudinally in the second plane and is at least partially aligned, along the orthogonal direction, to the magnetic-field generator.

* * * * *